(12) United States Patent
Akita et al.

(10) Patent No.: US 8,183,071 B2
(45) Date of Patent: May 22, 2012

(54) METHOD FOR PRODUCING NITRIDE SEMICONDUCTOR OPTICAL DEVICE AND EPITAXIAL WAFER

(75) Inventors: Katsushi Akita, Itami (JP); Yohei Enya, Itami (JP); Takashi Kyono, Itami (JP); Takamichi Sumitomo, Itami (JP); Yusuke Yoshizumi, Itami (JP); Masaki Ueno, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 498 days.

(21) Appl. No.: 12/539,887

(22) Filed: Aug. 12, 2009

(65) Prior Publication Data
US 2010/0055820 A1   Mar. 4, 2010

(30) Foreign Application Priority Data
Aug. 26, 2008   (JP) ................. 2008-217081

(51) Int. Cl.
*H01L 21/00*   (2006.01)
(52) U.S. Cl. ........................................... 438/31
(58) Field of Classification Search .............. 438/31, 438/32; 257/E31.127, 98, 432, 43
See application file for complete search history.

(56) References Cited

U.S. PATENT DOCUMENTS

| 6,562,646 | B2 * | 5/2003 | Watanabe et al. ............ 438/31 |
| 7,501,299 | B2 * | 3/2009 | Wong et al. .................. 438/31 |
| 2008/0137701 | A1 * | 6/2008 | Freund .................. 372/45.011 |
| 2008/0191192 | A1 * | 8/2008 | Feezell et al. ................. 257/13 |
| 2010/0273281 | A1 * | 10/2010 | Chakraborty et al. ........ 438/31 |

FOREIGN PATENT DOCUMENTS

| JP | 06-268257 | 9/1994 |
| JP | 10-012922 | 1/1998 |
| JP | 10-135514 | 5/1998 |
| JP | 11-224972 | 8/1999 |
| JP | 2002-043618 | 2/2002 |
| JP | 2005-268743 A | 9/2005 |
| JP | 2008-118049 A | 5/2008 |
| WO | WO-2006/130696 A2 | 12/2006 |

\* cited by examiner

*Primary Examiner* — Thao P Le
(74) *Attorney, Agent, or Firm* — Venable LLP; Michael A. Sartori

(57) ABSTRACT

In step S106, an $In_xGa_{1-x}N$ well layer is grown on a semipolar main surface between times t4 and t5 while a temperature in a growth furnace is maintained at temperature $T_W$. In step S107, immediately after completion of the growth of the well layer, the growth of a protective layer covering the main surface of the well layer is initiated at temperature $T_W$. The protective layer is composed of a gallium nitride-based semiconductor with a band gap energy that is higher than that of the well layer and equal to or less than that of a barrier layer. In step S108, the temperature in the furnace is changed from temperatures $T_W$ to $T_B$ before the barrier layer growth. The barrier layer composed of the gallium nitride-based semiconductor is grown on the protective layer between times t8 and t9 while the temperature in the furnace is maintained at temperature $T_B$.

20 Claims, 17 Drawing Sheets

FIG. 7

| | Growth temperature | Growth rate | TMGa | TMIn | TMAl | NH₃ |
|---|---|---|---|---|---|---|
| | °C | Å/min | μmol/min | μmol/min | μmol/min | slm |
| p+GaN | 1100 | 363 | 67.0 | — | — | 5 |
| p-GaN | 1100 | 582 | 98.7 | — | — | 5 |
| p-AlGaN | 1100 | 59 | 24.4 | — | 2.3 | 6 |
| ud-GaN | 1100 | 600 | 98.7 | — | — | 5 |
| N₂-GaN | 870 | 45 | 13.0 | — | — | 6 |
| InGaN well sublayer | 745 | 36 | 15.6 | 58.0 | — | 8 |
| GaN barrier sublayer | 870 | 67 | 24.4 | — | — | 6 |
| n-InGaN | 840 | 67 | 24.4 | 2.1 | — | 6 |
| n-GaN | 950 | 1296 | 243.8 | — | — | 7.5 |
| n-AlGaN | 1100 | 98 | 24.4 | — | 4.3 | 5 |
| pretreat | 1050 | — | — | — | — | 10 |

FIG. 10

| | Growth temperature | Growth rate | TMGa | TMIn | TMAl | NH₃ |
|---|---|---|---|---|---|---|
| | °C | Å/分 | μmol/min | μmol/min | μmol/min | slm |
| p+GaN | 1100 | 180 | 34.1 | — | — | 5 |
| p-Al0.06GaN | 1100 | 130 | 36.6 | — | 3.0 | 6 |
| p-Al0.18GaN | 1100 | 49 | 16.6 | — | 2.8 | 6 |
| ud-GaN | 1100 | 580 | 98.7 | — | — | 5 |
| ud-InGaN | 840 | 67 | 24.4 | 4.6 | — | 6 |
| InGaN intermediate layer | 745 | 31 | 15.6 | 0.3 | — | 8 |
| InGaN well sublayer | 745 | 31 | 15.6 | 29.0 | — | 8 |
| InGaN barrier sublayer | 870 | 67 | 24.4 | 1.6 | — | 6 |
| ud-InGaN | 840 | 67 | 24.4 | 4.6 | — | 6 |
| n-GaN | 1150 | 580 | 98.7 | — | — | 5 |
| n-AlGaN | 1150 | 460 | 98.7 | — | 8.2 | 6 |
| pretreat | 1100 | — | — | — | — | 10 |

US 8,183,071 B2

METHOD FOR PRODUCING NITRIDE SEMICONDUCTOR OPTICAL DEVICE AND EPITAXIAL WAFER

BACKGROUND OF THE INVENTION

1. Field of the Invention

The present invention relates to a method for producing a nitride semiconductor optical device and a method for producing an epitaxial wafer.

2. Description of the Related Art

Japanese Unexamined Patent Application Publication No. 2002-43618 discloses a nitride semiconductor light-emitting device. In its embodiments, light-emitting diodes are produced on a c-plane sapphire substrate and a GaN substrate. In the production of the nitride semiconductor light-emitting device, after a 2-nm-thick $In_{0.15}Ga_{0.85}N$ well layer is grown at 750° C., a 3-nm-thick GaN barrier layer is grown while the temperature is increased from 750° C. to 1,050° C. Then a 12-nm-thick GaN barrier layer is grown at 1,050° C. The light-emitting diode has a peak wavelength of about 460 nm.

Japanese Unexamined Patent Application Publication No. 10-12922 discloses a group III-nitride light-emitting device. A light-emitting layer of the group III-nitride light-emitting device is formed on a c-plane sapphire substrate and includes an AlGaN barrier layer and an InGaN well layer. The AlGaN barrier layer is grown at 1,100° C. The InGaN well layer is grown at 800° C.

Japanese Unexamined Patent Application Publication No. 10-135514 discloses a group III-nitride light-emitting device. A light-emitting layer of the group III-nitride light-emitting device is formed on an a-plane sapphire substrate and includes a GaN barrier layer and an InGaN well layer. The GaN barrier layer is grown at 900° C. The InGaN well layer is grown at 750° C.

Japanese Unexamined Patent Application Publication No. 06-268257 discloses a light-emitting diode formed on a c-plane sapphire substrate. In the production of an active layer of the light-emitting diode, the growth temperature of an InGaN well layer is the same as that of an InGaN barrier layer, which is 800° C.

Japanese Unexamined Patent Application Publication No. 11-224972 discloses a light-emitting diode formed on a c-plane sapphire substrate. In the production of an active layer of the light-emitting diode, the growth temperature of an InGaN well layer is the same as that of an InGaN barrier layer, which is 750° C.

SUMMARY OF THE INVENTION

In each of the light-emitting diodes disclosed in Japanese Unexamined Patent Application Publication Nos. 06-268257 and 11-224972, the InGaN well layer and the InGaN barrier layer were grown at the same temperature. In each of Japanese Unexamined Patent Application Publication Nos. 10-12922 and 10-135514, the InGaN well layer and the InGaN barrier layer were grown at different temperatures. Unfortunately, the semiconductor crystal constituting the well layer is decomposed during a period for which the temperature is increased from the well-layer-growth temperature to the barrier-layer-growth temperature after the growth of the well layer. The decomposition resulted in the deterioration in the crystalline quality of the well layer.

In the method described in Japanese Unexamined Patent Application Publication No. 2002-43618, after the growth of the well layer, the GaN barrier layer is grown while the temperature is increased from the well-layer-growth temperature to the barrier-layer-growth temperature. After the temperature reaches the barrier-layer-growth temperature, another GaN barrier layer is grown.

According to findings by the inventors, in the case where a well layer is grown on a c-plane main surface of a gallium nitride-based semiconductor, the semiconductor crystal constituting the well layer is decomposed during periods for which the temperature is increased from a well-layer-growth temperature to a barrier-layer-growth temperature and for which a barrier layer is grown at the barrier-layer-growth temperature. Such a phenomenon is not observed when a well layer composed of an indium-containing gallium nitride-based semiconductor is grown on a semipolar gallium nitride-based semiconductor. This is experimental findings by the inventors.

It is an object of the present invention to provide a method for producing a nitride semiconductor optical device having satisfactory luminescence properties by growing a semiconductor on a semipolar main surface of a gallium nitride-based semiconductor region. It is another object of the present invention to provide a method for producing an epitaxial wafer for the nitride semiconductor optical device.

According to an aspect of the present invention, a method for producing a nitride semiconductor optical device includes the steps of (a) growing a well layer on a gallium nitride-based semiconductor region having a semipolar main surface while a temperature in a growth furnace is maintained at a well-layer-growth temperature, the well layer constituting a part of an active layer, (b) growing a protective layer that covers the main surface of the well layer immediately after the completion of the growth of the well layer, and (c) growing a barrier layer on the main surface of the protective layer at a barrier-layer-growth temperature after the growth of the protective layer, the barrier layer constituting a part of the active layer. The thickness of the protective layer is smaller than the thickness of the barrier layer. The barrier-layer-growth temperature is higher than the well-layer-growth temperature. The barrier-layer-growth temperature is equal to or higher than a first temperature that is higher than the well-layer-growth temperature. The growth of the barrier layer is initiated when the temperature in the growth furnace reaches the first temperature. The growth temperature of the protective layer is the well-layer-growth temperature or more and less than the first temperature. The well layer is composed of an indium-containing gallium nitride-based semiconductor. The barrier layer is composed of a nitride semiconductor having a band gap energy larger than the band gap energy of the well layer. The protective layer is composed of a gallium nitride-based semiconductor having a band gap energy higher than the band gap energy of the well layer. The main surface of the well layer has a semipolar surface. The main surface of the protective layer has a semipolar surface. The main surface of the barrier layer has a semipolar surface.

According to this method, the well layer is grown on the main surface (semipolar surface) of the gallium nitride-based semiconductor region. Immediately after the completion of the growth of the well layer on the main surface, the protective layer is grown so as to cover the main surface of the well layer. Then the barrier layer is grown on the protective layer at the barrier-layer-growth temperature that is higher than the well-layer-growth temperature.

The semiconductor crystal constituting the well layer grown on the c-plane main surface is readily decomposed compared with the well layer grown on the semipolar surface. Thus, the use of the well layer grown on the semipolar surface results in a nitride semiconductor optical device having satisfactory luminescence properties. In the case where the barrier layer is grown at the barrier-layer-growth temperature that is higher than the well-layer-growth temperature, the degree of decomposition of the well layer covered with the protective layer is lower than that of the well layer grown on the c-plane main surface because the well layer is covered with the protective layer.

The method according to the present invention may further include a step of increasing the temperature in the growth furnace from the well-layer-growth temperature to the first temperature without growing a semiconductor after the growth of the protective layer. The protective layer may be grown at the same temperature as the well-layer-growth temperature before the initiation of the temperature change in the growth furnace.

In this case, the protective layer is grown before the initiation of the temperature change in the growth furnace. That is, after the protective layer is grown on the well layer, the increase in temperature in the growth furnace is initiated. The well layer is covered with the protective layer and then exposed to a temperature higher than the well-layer-growth temperature.

In the method according to the present invention, the protective layer may be grown while the temperature in the growth furnace is being increased from the well-layer-growth temperature.

In this case, immediately after the completion of the growth of the well layer, the protective layer is grown. The growth is performed while the temperature in the growth furnace is being increased from the well-layer-growth temperature. That is, the growth of the protective layer is initiated simultaneously with the initiation of the temperature increase. Thus, the well layer is covered with the protective layer at a temperature higher than the well-layer-growth temperature. The resulting well layer covered with the protective layer is not readily decomposed compared with a well layer that is not covered with a protective layer. As described above, furthermore, the decomposition of the semiconductor crystal constituting the well layer having the semipolar main surface does not readily occur compared with a well layer grown on the c-plane main surface. Thus, a nitride semiconductor optical device including the well layer grown on the semipolar surface according to the present invention has satisfactory luminescence properties.

Moreover, the protective layer is grown during the temperature increase; hence, the crystallinity of the protective layer is improved as the growth proceeds.

In the method the present invention, the protective layer may be grown over a period for which the temperature in the growth furnace is changed from the well-layer-growth temperature to the first temperature, and the barrier layer may be grown immediately after the growth of the protective layer.

In this case, immediately after the growth of the well layer, the protective layer is grown while the temperature in the growth furnace is being increased from the well-layer-growth temperature to the first temperature that is equal to or lower than the barrier-layer-growth temperature. The effect of the protective layer (effect of protecting the well layer) is also provided by part of the protective layer grown at a relatively low temperature. The protective effect is not lost even if the remainder of the period for which the temperature is changed without performing a growth operation is replaced with a period for which a semiconductor layer is grown. That is, the temperature in the growth furnace is increased while the protective layer is being grown. Thus, the well layer is covered with the protective layer when the well layer is exposed to a temperature higher than the well-layer-growth temperature. Furthermore, the semiconductor crystal constituting the well layer having the semipolar main surface is not readily decomposed compared with a semiconductor crystal constituting a well layer grown on the c-plane surface. Moreover, the protective layer is grown during the temperature increase; hence, the crystallinity of the protective layer is improved as the growth proceeds.

In the method according to the present invention, the protective layer may be grown while the temperature in the growth furnace is being increased from the well-layer-growth temperature to a second temperature that is lower than the barrier-layer-growth temperature.

The method may further include after the growth of the protective layer, a step of increasing the temperature in the growth furnace from the second temperature to the first temperature without growing a gallium nitride-based semiconductor. The average heating rate from the well-layer-growth temperature to the second temperature may be higher than the average heating rate from the second temperature to the first temperature.

In this case, after the growth of the protective layer, the temperature in the growth furnace is increased. The growth of the protective layer is performed during a part of the temperature-rise period. Furthermore, the rate of temperature change during the temperature-rise period is high. Thus, the protective layer is grown at a higher temperature as the growth proceeds, thereby resulting in the protective layer with satisfactory crystalline quality.

In the method according to the present invention, the barrier-layer-growth temperature may be maintained at constant. In this case, the entire barrier layer is grown at a temperature equal to or higher than a temperature at which the effect of the barrier layer is sufficiently acquired. The resulting barrier layer achieves high performance. Furthermore, by maintaining the barrier-layer-growth temperature at constant, the difference between the barrier-layer-growth temperature and the well-layer-growth temperature is not increased.

In the method according to the present invention, at least part of the barrier layer may be grown while the temperature is being changed from the first temperature to a third temperature that is higher than the first temperature.

In this case, at least part of the barrier layer is grown while the temperature in the growth furnace is being changed. The entire barrier layer, however, is grown at a temperature equal to or higher than a temperature at which the effect of the barrier layer is sufficiently acquired.

In the method according to the present invention, the average heating rate from the well-layer-growth temperature to the first temperature may be higher than the average heating rate from the first temperature to the third temperature.

In this case, the increase in temperature from the well-layer-growth temperature to the barrier-layer-growth temperature is mostly performed during the growth period of the protective layer. Thus, the growth furnace can be set at a sufficiently high temperature when the growth of the barrier layer is initiated.

In the method according to the present invention, the amount of a gallium source supplied for the growth of the protective layer may be smaller than the amount of the gallium source supplied for the growth of the barrier layer. In this case, the growth rates of the protective layer and the barrier layer are adjusted in response to the amount of the gallium source supplied.

The method according to the present invention may further include a step of preparing a substrate composed of a hexagonal semiconductor $In_SAl_TGa_{1-S-T}N$ ($0 \leq S \leq 1$, $0 \leq T \leq 1$, and $0 \leq S+S+T \geq 1$). A main surface of the substrate may be tilted at an angle of 10° to 85° with respect to the {0001} or {000-1} plane of the hexagonal semiconductor. In this case, to provide the semipolar surface, the tilt angle of the main surface of the substrate for growth is preferably specified.

The method according to the present invention may further include a step of subjecting the main surface of the substrate to heat treatment to form a modified main surface on the substrate before the film-forming step (step of forming the semiconductor on the main surface of the substrate). The heat treatment may be performed in a gas atmosphere containing ammonia and hydrogen. The gallium nitride-based semiconductor region may be provided on the modified main surface of the substrate.

In this case, the adjustment of the tilt angle of the main surface results in the formation of the semipolar main surface. The semipolar main surface has a surface structure different from the c-plane main surface. By subjecting the main surface of the substrate to the heat treatment before the film-forming step, the modification, which does not occur on the c-plane main surface, occurs on the semipolar main surface.

The method according to the present invention may further include a step of epitaxially growing a first-conductivity-type gallium nitride-based semiconductor region on the substrate. The main surface of the first-conductivity-type gallium nitride-based semiconductor region may be tilted at an angle of more than 50° and less than 80° with respect to the {0001} or {000-1} plane of the gallium nitride-based semiconductor.

In this case, the structure of the main surface of the first-conductivity-type gallium nitride-based semiconductor region can be formed by tilting the main surface of the substrate. The main surface that is tilted at an angle of more than 50° and less than 80° with respect to the {0001} or {000-1} plane of the hexagonal semiconductor $In_SAl_TGa_{1-S-T}N$ substrate, i.e., a relatively high tilt angle, is suitable for the growth of an indium-containing gallium nitride-based semiconductor.

In the method according to the present invention, the substrate may include a plurality of first regions in which the density of threading dislocations extending to the direction of the c-axis is higher than a first threading dislocation density, and a plurality of second regions in which the density of threading dislocations extending to the direction of the c-axis is lower than the first threading dislocation density. The first and second regions may be alternately arranged. The first and second regions may be exposed on the main surface of the substrate. In this case, the second regions each having a lower threading dislocation density can be used for the production of semiconductor devices.

In the method according to the present invention, each of the second regions may have a threading dislocation density of less than $1 \times 10^7$ cm$^{-2}$. In this case, an active layer with a low dislocation density can be grown.

In the method according to the present invention, the substrate may be composed of GaN. In this case, epitaxial growth can be performed with satisfactory crystalline quality.

In the method according to the present invention, the main surface of the gallium nitride-based semiconductor region may be tilted toward the direction of the a-axis of the gallium nitride-based semiconductor region. In this case, cleavage can be made along the m-plane. Furthermore, in the method according to the present invention, the main surface of the gallium nitride-based semiconductor region may be tilted toward the direction of the m-axis of the gallium nitride-based semiconductor region. In this case, a satisfactory incorporation efficiency of indium is provided, thus resulting in satisfactory luminescence properties. Moreover, in the method according to the present invention, the main surface of the gallium nitride-based semiconductor region may be tilted toward the direction of the <12-30> axis of the gallium nitride-based semiconductor region.

According to another aspect of the present invention, a method for producing an epitaxial wafer used for a nitride semiconductor optical device includes the steps of (a) preparing a substrate composed of a hexagonal semiconductor $In_SAl_TGa_{1-S-T}N$ ($0 \leq S \leq 1$, $0 \leq T \leq 1$, and $0 \leq S+T \leq 1$) and having a semipolar main surface, (b) forming a gallium nitride-based semiconductor region on the main surface of the substrate, the gallium nitride-based semiconductor region having a semipolar main surface, (c) growing a well layer on the gallium nitride-based semiconductor region while a temperature in a growth furnace is maintained at a well-layer-growth temperature, the well layer constituting a part of an active layer, (d) growing a protective layer that covers the main surface of the well layer, and (e) growing a barrier layer on the main surface of the protective layer at a barrier-layer-growth temperature after the growth of the protective layer, the barrier layer constituting a part of the active layer. The thickness of the protective layer is smaller than the thickness of the barrier layer. The barrier-layer-growth temperature is higher than the well-layer-growth temperature. The barrier-layer-growth temperature is equal to or higher than a first temperature that is higher than the well-layer-growth temperature. The growth of the barrier layer is initiated when the temperature in the growth furnace reaches the first temperature. The growth temperature of the protective layer is the well-layer-growth temperature or more and less than the first temperature. The well layer is composed of an indium-containing gallium nitride-based semiconductor. The barrier layer is composed of a nitride semiconductor having a band gap energy higher than the band gap energy of the well layer. The protective layer is composed of a gallium nitride-based semiconductor having a band gap energy higher than the band gap energy of the well layer. The main surface of the well layer has a semipolar surface. The main surface of the protective layer has a semipolar surface. The main surface of the barrier layer has a semipolar surface.

According to this method, the well layer is grown on the main surface (semipolar surface) of the gallium nitride-based semiconductor. Immediately after the completion of the growth of the well layer on the main surface, the protective layer is grown so as to cover the main surface of the well layer. Then the barrier layer is grown on the protective layer at the barrier-layer-growth temperature that is higher than the well-layer-growth temperature.

The semiconductor crystal constituting the well layer grown on the semipolar main surface is not readily decomposed compared with a well layer grown on the c-plane main surface. In the case where the barrier layer is grown at the barrier-layer-growth temperature that is higher than the well-layer-growth temperature, the degree of decomposition of the semiconductor crystal constituting the well layer which is grown on the semipolar surface and which is covered with the protective layer is lower than a well layer grown on the c-plane main surface.

In contrast, the well layer grown on the c-plane main surface is readily decomposed compared with the well layer grown the semipolar main surface.

According to this method, therefore, it is possible to produce a nitride semiconductor optical device with satisfactory luminescence properties.

The method according to the present invention may further include a step of subjecting the main surface of the substrate to heat treatment to form a modified main surface on the substrate before the film-forming step (step of forming the semiconductor on the substrate). The heat treatment may be performed in a gas atmosphere containing ammonia and hydrogen. The main surface of the substrate may be tilted at an angle of more than 50° and less than 80° with respect to the {0001} or {000-1} plane of the hexagonal semiconductor.

In this case, the tilt angle of the main surface may be adjusted to form the semipolar main surface. The semipolar main surface has a surface structure different from the c-plane main surface. The main surface of the substrate may undergo the heat treatment to modify the main surface. Note that the modification does not occur on the c-plane main surface. Furthermore, the structure of the main surface of the gallium nitride-based semiconductor region can be formed by tilting the main surface of the substrate. The main surface that is tilted at an angle of more than 50° and less than 80° with respect to the {0001} or {000-1} plane of the hexagonal semiconductor $In_S Al_T Ga_{1-S-T}N$, i.e., a relatively high tilt angle, is suitable for the growth of an indium-containing gallium nitride-based semiconductor.

The foregoing objects, another object, features, and advantages of the present invention would be readily apparent by detailed description of preferred embodiments of the present invention with reference to the attached drawings.

As described above, according to the present invention, there is provided the method for producing a nitride semiconductor optical device having satisfactory luminescence properties on a semipolar main surface of a gallium nitride-based semiconductor region. Furthermore, there is provided a method for producing an epitaxial wafer for the nitride semiconductor optical device.

BRIEF DESCRIPTION OF THE DRAWINGS

FIG. 7 is a table showing main production conditions in Example 1;

FIG. 10 is a table showing main production conditions in Example 2;

DESCRIPTION OF THE PREFERRED EMBODIMENTS

Figure 1A:
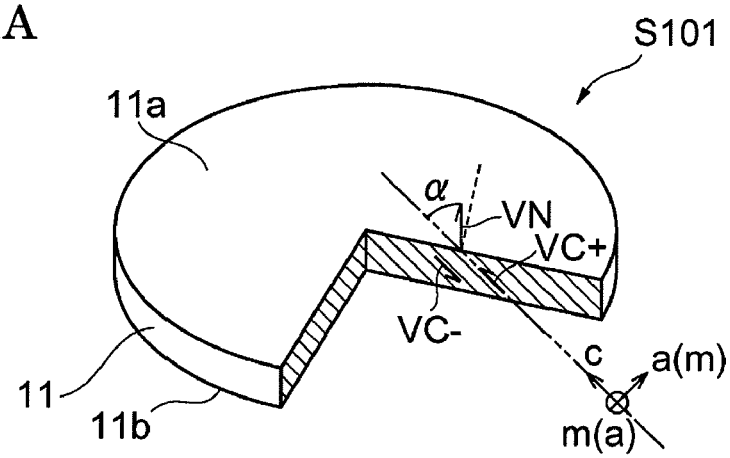
FIGS. 1A to 1C illustrate main steps in a method for producing a nitride semiconductor optical device and a method for producing an epitaxial wafer according to an embodiment of the present invention.

Findings of the present invention can be readily appreciated in view of the following detailed description with reference to the attached illustrative drawings. Methods for producing a nitride semiconductor optical device and an epitaxial wafer according to embodiments of the present invention will be described below with reference to the attached drawings. The same elements are designated using the same reference numerals, if possible. In the following description, for example, <000-1> represents the direction opposite to the <0001> axis.

First Embodiment

FIGS. 1A to 4B shows main steps in methods for producing a nitride semiconductor optical device and an epitaxial wafer according to this embodiment.

Referring to FIG. 1A, in step S101, a substrate 11 for use in the production of a nitride semiconductor optical device and an epitaxial wafer is prepared. For example, the substrate 11 may be composed of a hexagonal semiconductor $In_S Al_T Ga_{1-S-T}N$ ($0 \leq S \leq 1$, $0 \leq T \leq 1$, $0 \leq S+T \leq 1$). The substrate 11 has a main surface 11a and an undersurface 11b. FIG. 1A shows a vector VC+ indicating the direction of the c-axis of the hexagonal semiconductor of the substrate 11 and a normal vector VN of the main surface 11a. The vector VC+ indicates the direction of the {0001} plane. A vector VC− is opposite in direction to the vector VC+ and indicates the direction of the {000-1} plane. In the substrate 11, the main surface for deposition has a tilt angle (off-angle) α; hence, the substrate 11 can have the semipolar main surface 11a. The main surface 11a of the substrate 11 is tilted at an angle of 10° to 85° with respect to the {0001} or {000-1} plane of the hexagonal semiconductor. The hexagonal semiconductor may be, for example, GaN or AlN. A tilt angle of the main surface 11a of 10° or more results in the effect of sufficiently reducing a piezoelectric field. A tilt angle of the main surface 11a of 85° or less results in a satisfactory quality of a crystal grown thereon. Thereby, a nitride semiconductor optical device and an epitaxial wafer having excellent luminescence properties can be provided.

The maximum distance between two points on the edge of the substrate 11 may be 45 mm or more. Such a substrate is referred to as, for example, a wafer. The undersurface 11b of the substrate 11 may be substantially parallel to the main surface 11a of the substrate 11. Use of the substrate 11 composed of GaN permits epitaxial growth of a crystal with good quality.

In the subsequent step, a semiconductor crystal is epitaxially grown on the main surface 11a of the substrate 11 (step S103 described below). An epitaxial semiconductor region formed on the main surface 11a with the tilt angle functions as an underlying layer for growing an active layer. The epitaxial semiconductor region is formed so as to have its main surface that is tilted at an angle of 10° to 85° with respect to the c-plane of a gallium nitride-based semiconductor.

The main surface 11a may be tilted at an angle of more than 50° and less than 80° with respect to the {0001} or {000-1} plane of the hexagonal semiconductor. The structure of the main surface 11a depends on the tilt of the main surface. The main surface 11a that is tilted at an angle of more than 50° and less than 800 with respect to the {0001} or {000-1} plane of the hexagonal semiconductor $In_SAl_TGa_{1-S-T}N$ substrate, i.e., a relatively high tilt angle, is suitable for the growth of an indium-containing gallium nitride-based semiconductor region. Specifically, when the tilt angle of the main surface 11a exceeds 50°, a semiconductor crystal serving as a well layer grown thereon is not readily decomposed. A tilt angle of the main surface 11a of less than 80° results in an increase in the incorporation efficiency of indium into a crystal grown thereon.

The direction of the tilt of the main surface 11a will be described below. The tilt of the main surface 11a toward the a-axis of the hexagonal semiconductor constituting the substrate 11 enables an epitaxial substrate formed on the substrate 11 to be cleaved along the m-plane. The tilt of the main surface 11a toward the m-axis of the hexagonal semiconductor constituting the substrate 11 results in an increase in the incorporation efficiency of indium into a crystal grown thereon, thereby providing satisfactory luminescence properties. The tilt of the main surface 11a toward the <12-30> axis of the hexagonal semiconductor constituting the substrate 11 further increases the incorporation efficiency of indium.

Figure 1B:
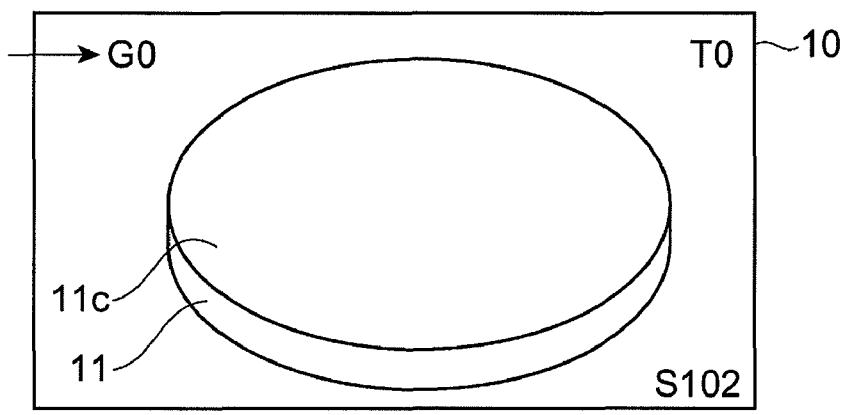

Referring to FIG. 1B, the substrate 11 is placed in a growth furnace 10. In step S102, the substrate 11 is subjected to heat treatment while the growth furnace 10 is being supplied with a gas G0, thereby modifying the main surface 11a to form a modified main surface 11c. The heat treatment may be performed in an atmosphere containing ammonia and hydrogen or an atmosphere containing nitrogen. A heat treatment temperature TO may be in the range of, for example, 800° C. to 1,200° C. The heat treatment time is, for example, about 10 minutes. In this step, the semipolar main surface having a surface structure different from that of a main surface of the c-plane is formed owing to the tilt of the main surface 11a. The heat treatment of the main surface 11a may be carried out before deposition to modify the semiconductor main surface. This modification is not observed on the main surface of the c-plane. Then an epitaxial layer composed of a gallium nitride-based semiconductor is formed on the modified main surface 11c.

Microsteps are formed by the heat treatment on the main surface 11c of the substrate 11. The microsteps include a plurality of terraces. The density of the microsteps may be, for example, $2.0 \times 10^4$ cm$^{-1}$ or more and may be $3.3 \times 10^7$ cm$^{-1}$. The height of each of the microsteps may be in the range of, for example, 0.3 nm to 10 nm. The length of the microsteps may be, for example, 0.3 nm or more and may be 500 nm.

Figure 1C:
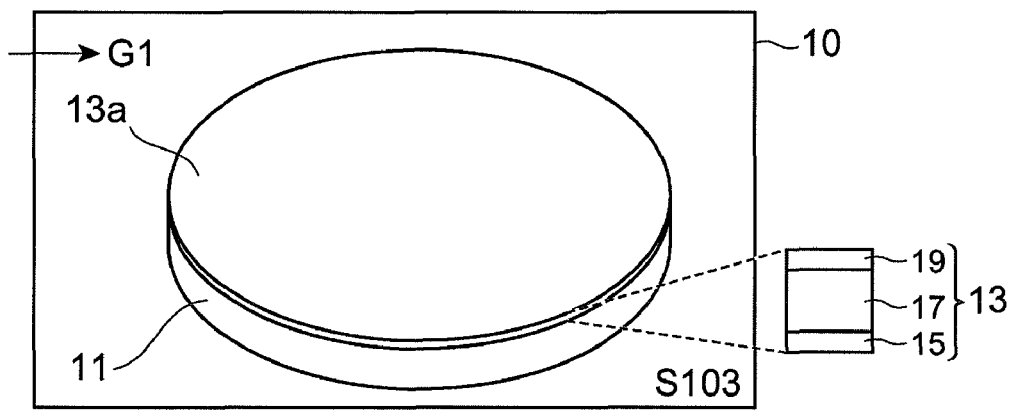

Referring to FIG. 1C, in step S103, a first-conductivity-type gallium nitride-based semiconductor region 13 is epitaxially grown on the main surface 11c of the substrate 11. For the growth, a source gas G1 is fed into the growth furnace 10. The main surface 13a of the gallium nitride-based semiconductor region 13 is tilted at an angle of 10° to 85° with respect to the c-plane of the gallium nitride-based semiconductor region. Because the main surface 13a takes over the structure of the main surface 11c of the substrate 11, the main surface 13a has microsteps similar to the structure of the main surface 11c of the substrate 11. The first-conductivity-type gallium nitride-based semiconductor region 13 may be provided with a single or plurality of gallium nitride-based semiconductor layers (for example, gallium nitride-based semiconductor layers 15, 17, and 19). For example, the gallium nitride-based semiconductor layers 15, 17, and 19 may be an n-type AlGaN layer, an n-type GaN layer, and an n-type InGaN layer, respectively. The gallium nitride-based semiconductor layers 15, 17, and 19 are epitaxially grown on the main surface 11c of the substrate 11, in that order. The n-type AlGaN layer serves as, for example, an intermediate layer covering the entire surface of the substrate 11. The n-type GaN layer serves as, for example, a layer configured to supply n-type carriers. The n-type InGaN layer serves as a buffer layer for an active layer.

The structure of the main surface of the first-conductivity-type gallium nitride-based semiconductor region is attributed to the tilt of the main surface of the substrate. In the epitaxial growth of the first-conductivity-type gallium nitride-based semiconductor region 13, thus, the structure of the main surface 11c of the underlying substrate 11 is taken over by the main surface 13a. The main surface 13a is tilted at an angle corresponding to the off-angle of the substrate 11 with respect to the {0001} or {000-1} plane of the gallium nitride-based semiconductor. For example, a tilt angle of the main surface 11c of the substrate 11 of more than 50° and less than 80°, i.e., a relatively high tilt angle, is suitable for the growth of an indium-containing gallium nitride-based semiconductor on the substrate.

Figure 5:
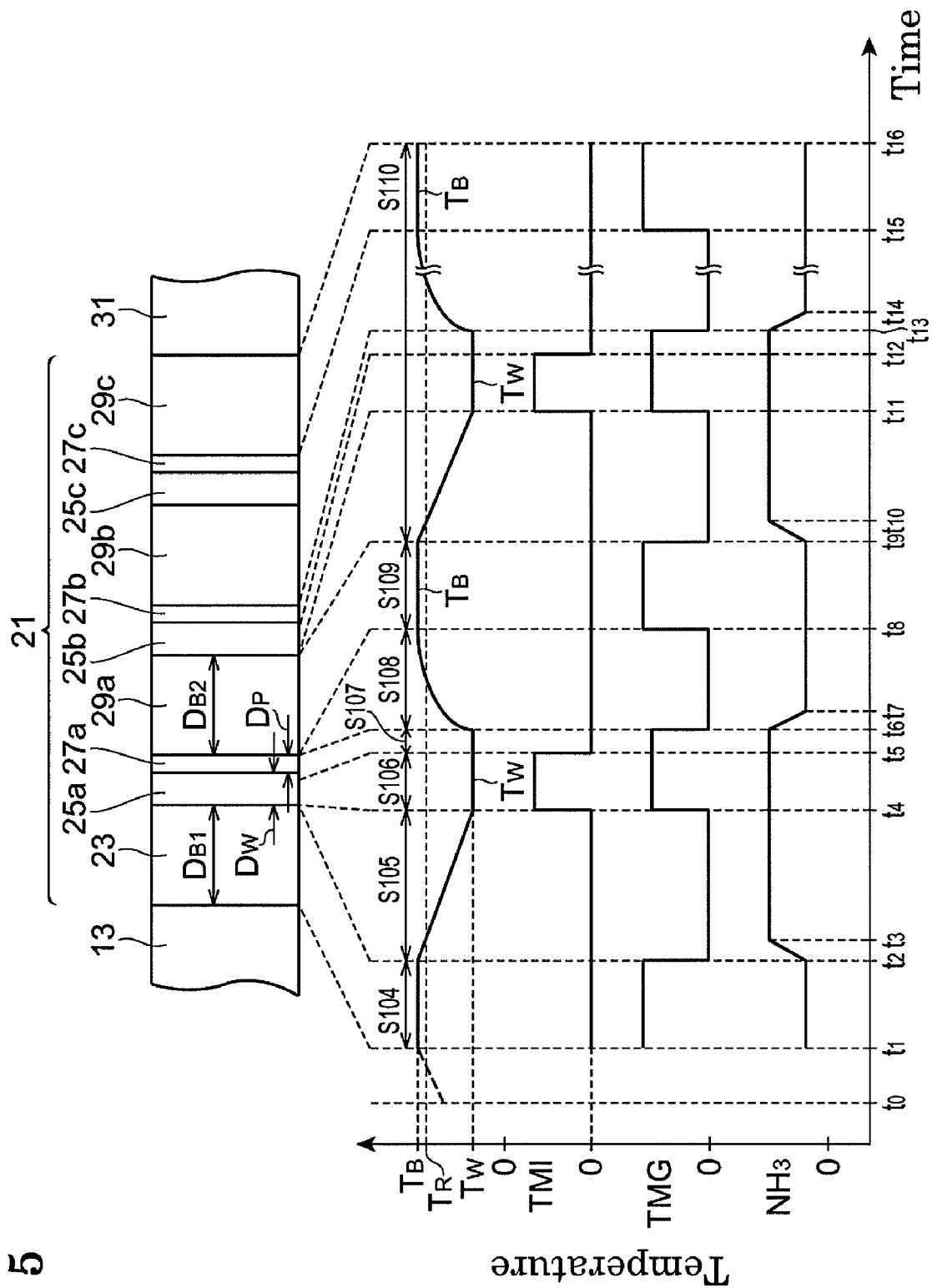
FIG. 5 is a time chart showing the flow of raw-material gases and a change in temperature in a growth furnace during the formation of an active layer according to a first embodiment.

Referring to FIG. 2A to FIG. 3C and FIG. 5, in the next step, an active layer 21, shown in FIG. 5, of a nitride semiconductor light emitting device is formed. The active layer 21 is formed so as to show an electroluminescence spectrum with a peak wavelength of 370 to 650 nm.

A process of forming the quantum well structure of the active layer 21 will be described in detail below with reference to FIG. 5. FIG. 5 is a time chart showing the flow of raw-material gases and a change in temperature in the growth furnace during the formation of the active layer. The temperature of the growth furnace is monitored as a temperature of a component, such as a susceptor, in the growth furnace. As the source gases, a gallium source, an indium source, and a nitrogen source are used. The gallium source, the indium source, and the nitrogen source are, for example, trimethylgallium (TMG), trimethylindium (TMI), and $NH_3$.

As shown in FIG. 5, at time t0, the deposition of the gallium nitride-based semiconductor that will be overlaid with the active layer is completed. The temperature in the growth furnace 10 is changed to a temperature at which a semiconductor constituting the active layer is grown, between times t0 and t1.

Figure 2A:
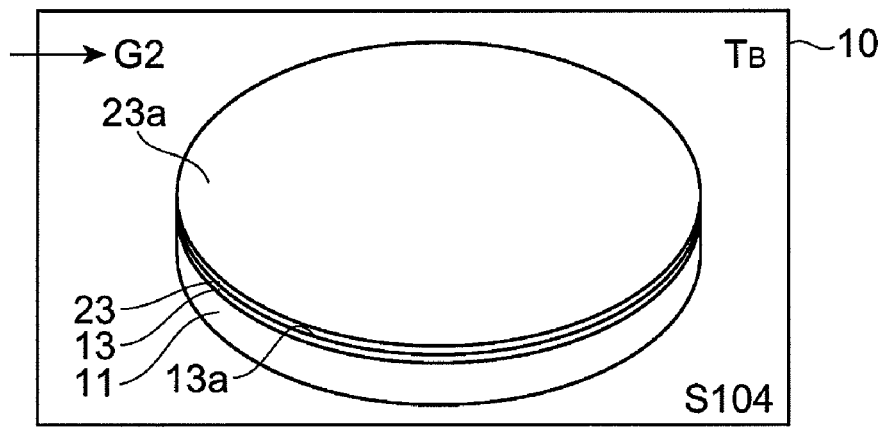
FIGS. 2A to 2C illustrate the main steps in the method for producing a nitride semiconductor optical device and the method for producing an epitaxial wafer according to the embodiment of the present invention.

As shown in FIG. 2A, in step S104, an epitaxial semiconductor region 23 composed of a gallium nitride-based semiconductor is formed. The epitaxial semiconductor region 23 is grown on the buffer layer (gallium nitride-based semiconductor layer 19). The epitaxial semiconductor region 23 serves as, for example, a barrier layer for the quantum well structure of the active layer 21. The barrier layer is composed of $In_YGa_{1-Y}N$ (indium composition Y: $0 \leq Y \leq 0.05$; Y represents a strain composition). The barrier layer may be composed of GaN, InGaN, AlGaN, or the like. The barrier layer is grown at a growth temperature $T_B$ of 700° C. to 900° C. In this embodiment, a source gas G2 containing a gallium source and a nitrogen source is fed into the growth furnace 10 to grow GaN. This growth is performed at the growth temperature $T_B$ between times t1 and t2 shown in FIG. 5. The GaN barrier layer $D_{B1}$ has a thickness of, for example, 15 nm.

At time t2, the supply of the gallium source is stopped to terminate the deposition of the gallium nitride-based semiconductor.

The epitaxial semiconductor region 23 is grown on the main surface 13a. Thus, the surface structure of the main surface 13a is taken over by the surface of the epitaxial semiconductor region 23. That is, the epitaxial semiconductor region 23 has a main surface 23a tilted at an angle of 10° to 85° with respect to the c-plane of the gallium nitride-based semiconductor.

Figure 2B:
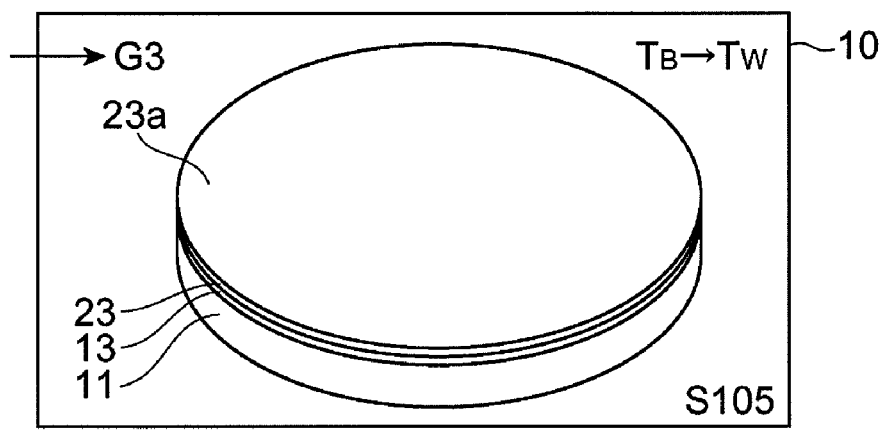

As shown in FIG. 2B, in step S105, the temperature in the growth furnace is changed from the growth temperature $T_B$ to a growth temperature $T_W$. The temperature is changed between times t2 and t4 shown in FIG. 5. During this change period, a nitrogen source gas G3, such as ammonia, is fed into the growth furnace 10. In the case where the amount of the nitrogen source supplied for the growth of the barrier layer is different from the amount of the nitrogen source supplied for the growth of a well layer, the amount of the nitrogen source supplied is changed to the amount of the nitrogen source supplied for the growth of the well layer. The flow rate of the nitrogen source is changed during at least part of the change period. Specifically, the change is made from the flow rate of the nitrogen source for the growth of the barrier layer to the flow rate of the nitrogen source for the growth of the well layer. This change is made between times t2 and t3 shown in FIG. 5.

At time t4, the temperature in the growth furnace 10 reaches the growth temperature $T_W$ of the well layer.

Figure 2C:
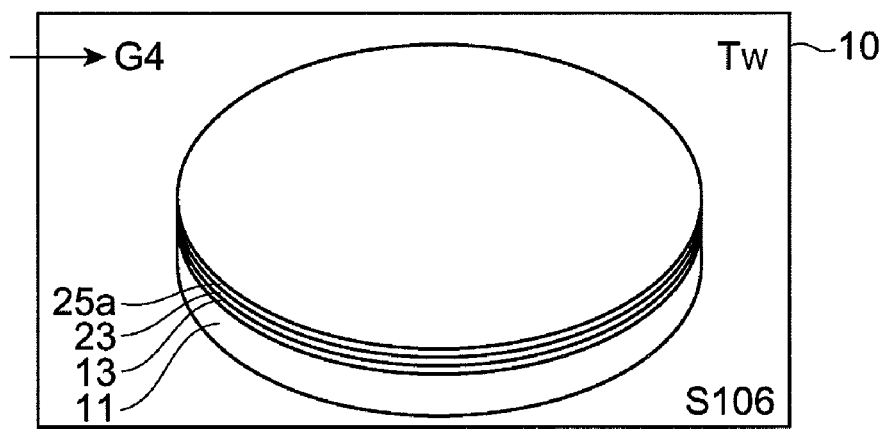

As shown in FIG. 2C, in step S106, a well layer 25a for the quantum well structure is grown on the semipolar main surface 23a of the epitaxial semiconductor region 23 between times t4 and t5 while the temperature in the growth furnace 10 is maintained at the growth temperature $T_W$ of the well layer. The well layer 25a is composed of an indium-containing gallium nitride-based semiconductor such as $In_XGa_{1-X}N$ (indium composition X: 0<x<1, X represents a strain composition). The well layer 25a has a lower band gap energy than the band gap energy of the barrier layer 23. As shown in FIG. 5, the growth temperature $T_W$ of the well layer 25a is lower than the growth temperature $T_B$. In this embodiment, a raw-material gas G4 containing a gallium source, an indium source, and a nitrogen source is fed into the growth furnace 10 to grow InGaN. The well layer 25a is epitaxially grown on the main surface of the epitaxial semiconductor region 23. Thus, the surface structure of the epitaxial semiconductor region 23 is taken over by the surface of the well layer 25a. Furthermore, the surface of the well layer 25a is tilted at an angle of 10° to 85° with respect to the c-plane of the gallium nitride-based semiconductor, in response to the tilt angle of the main surface of the epitaxial semiconductor region 23. The well layer 25a is grown at a growth temperature $T_W$ of, for example, 650° C. to 850° C. The InGaN well layer has a thickness $D_W$ of, for example, 2.5 nm.

At time t5, the growth of the well layer 25a is completed.

Figure 3A:
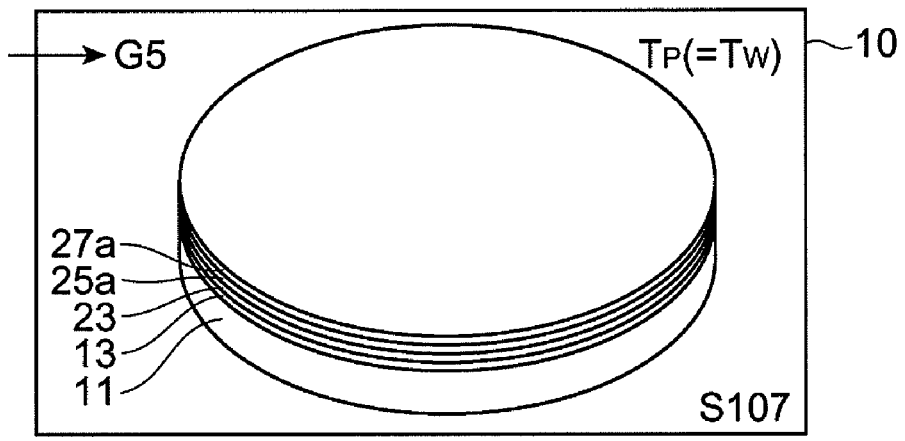
FIGS. 3A to 3C illustrate the main steps in the method for producing a nitride semiconductor optical device and the method for producing an epitaxial wafer according to the embodiment of the present invention.

As shown in FIG. 3A, in step S107, immediately after the completion of the growth of the well layer 25a, a protective layer 27a is grown on the main surface of the well layer 25a at the temperature $T_p$ so as to cover the main surface. The protective layer 27a is composed of a gallium nitride-based semiconductor having a higher band gap energy than that of the well layer 25a. The protective layer 27a may be composed of, for example, GaN, InGaN, AlGaN, or the like. For example, the protective layer 27a is composed of $In_ZGa_{1-Z}N$ (indium composition Z: 0≦z≦1, Z represents a strain composition). Alternatively, the protective layer 27a may be composed of a gallium nitride-based semiconductor having a band gap energy equal to or lower than that of the barrier layer 23.

In this embodiment, the well-layer-growth temperature $T_W$ is used as a temperature $T_p$. Thus, the protective layer 27a is grown on the semipolar main surface of the well layer 25a between times t5 and t6 while the temperature of the growth furnace 10 is maintained at the growth temperature $T_W$. The growth of the protective layer 27a is initiated immediately after the completion of the growth of the well layer 25a. This eliminates the exposure of the surface of the well layer 25a to the atmosphere in the growth furnace during a period in which the protective layer is not formed. As shown in FIG. 5, the growth temperature $T_W$ of the protective layer 27a is the same as the growth temperature $T_W$ of the well layer 25a. According to this method, the protective layer 27a is grown before the change of the temperature in the growth furnace 10. That is, an increase in temperature in the growth furnace 10 is initiated after the growth of the protective layer 27a on the well layer 25a. The well layer 25a is exposed to a high temperature after covered with the protective layer 27a.

In this embodiment, a raw-material gas G5 containing a gallium source and a nitrogen source is fed into the growth furnace 10 to grow GaN. The protective layer 27a is epitaxially grown on the main surface of the well layer 25a. Thus, the surface structure of the well layer 25a is taken over by the surface of the protective layer 27a. The surface of the protective layer 27a is tilted at an angle of 10° to 85° with respect to the c-plane of the gallium nitride-based semiconductor, in response to the tilt angle of the main surface of the well layer 25a. The protective layer 27a is grown at a growth temperature $T_W$ of, for example, 650° C. to 850° C. The thickness $D_P$ of the protective layer 27a is smaller than the thickness $D_B$ of the barrier layer 23. Furthermore, the thickness $D_P$ of the protective layer 27a is smaller than the thickness $D_W$ of the well layer 25a. The protective layer 27a has a thickness $D_P$ of, for example, 1.0 nm.

At time t6, the supply of the gallium source is stopped to terminate the deposition of the gallium nitride-based semiconductor.

Figure 3B:
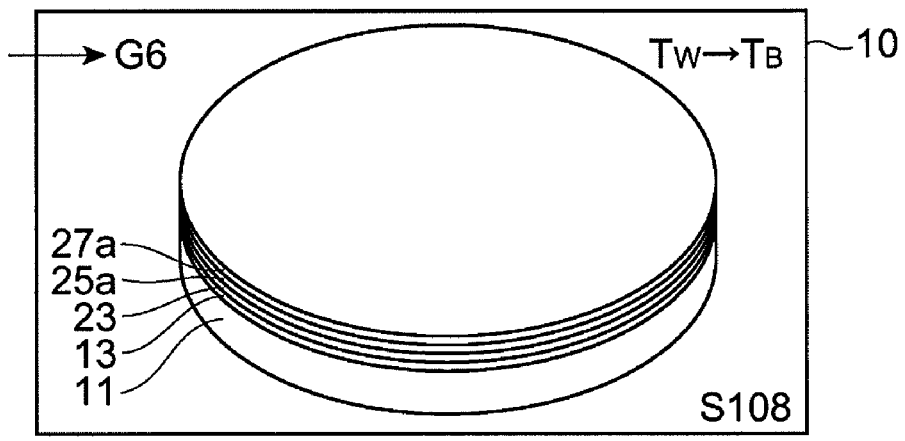

As shown in FIG. 3B, in step S108, the temperature in the growth furnace 10 is changed from the growth temperature $T_W$ to the growth temperature $T_B$. The temperature is changed between times t6 to t8 shown in FIG. 5. A nitrogen source gas G6, such as ammonia, is fed into the growth furnace 10 during the change period. In the case where the amount of the nitrogen source supplied for the growth of the protective layer 27a is different from the amount of the nitrogen source supplied for the growth of the barrier layer, the amount of the nitrogen source supplied is changed to the amount of the nitrogen source supplied for the growth of the barrier layer. The flow rate of the nitrogen source is changed from the flow rate of the nitrogen source for the growth of the protective layer to the flow rate of the nitrogen source for the growth of the barrier layer during at least part of the change period. This change is made between times t6 and t7 shown in FIG. 5. In the change in temperature for the change period, the rate of temperature increase is reduced with time, so that the temperature profile curve between times t6 and t7 is convex upward. According to this heating profile, a period of time required to increase the temperature to growth temperature $T_B$ and stabilize the temperature is reduced, thereby preventing the deterioration of the well layer. For example, the average rate of change in temperature for a period prior to a time within the temperature-rise period is higher than the average rate of change in temperature for a period after the time. Here, approximations are made by connecting the starting point and the endpoint of each period with a straight line to obtain the average rates.

According to this method, the well layer 25a is grown on the semipolar main surface 23a. Immediately after the completion of the growth of the well layer 25a on the main surface 23a, the protective layer 27a is grown so as to cover the main surface of the well layer 25a. Then the temperature in the growth furnace 10 is changed to the barrier-layer-growth temperature $T_B$ higher than the well-layer-growth temperature $T_W$ in order to grow the barrier layer. Meanwhile, the decomposition of the semiconductor crystal of a well layer grown on the main surface of the c-plane, i.e., the mixing of the well layer crystal and the protective layer crystal or indium segregation in the well layer crystal, occurs more readily than the well layer grown on the semipolar surface. Thus, in the case where the barrier layer is grown at growth temperature $T_B$ after the growth of the well layer 25a, the degree of decomposition of the semiconductor crystal of the well layer 25a covered with the protective layer 27a is smaller than the well layer on the main surface of the c-plane. Thereby, a nitride semiconductor optical device having satisfactory luminescence properties is produced on the semipolar surface of the gallium nitride-based semiconductor region.

At time t8, the increase in temperature in the growth furnace 10 is completed.

Figure 3C:
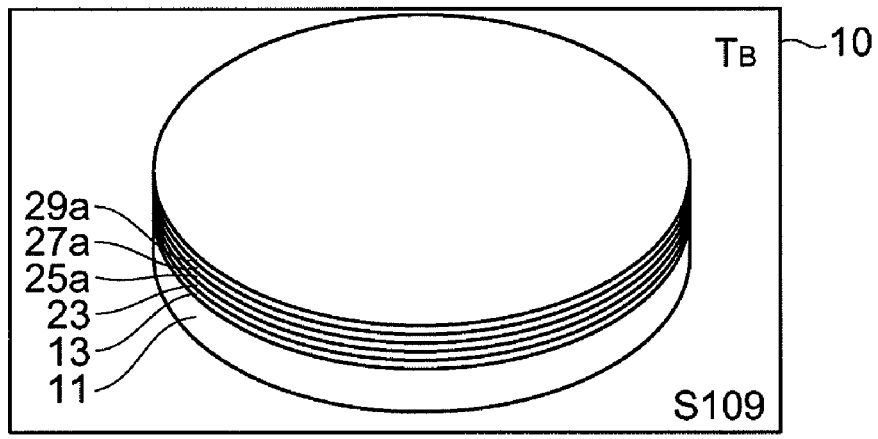

As shown in FIG. 3C, in step S109, a barrier layer 29a composed of a gallium nitride-based semiconductor is grown between times t8 and t9 while the temperature in the growth furnace 10 is maintained at the growth temperature $T_B$.

The growth temperature $T_B$ is higher than the growth temperature $T_W$. Also, the growth temperature $T_B$ is equal to or higher than a first temperature $T_R$ that enables the barrier layer having satisfactory crystalline quality to grow. When the temperature in the growth furnace reaches first temperature $T_R$, the growth of the barrier layer 29a is initiated.

The growth temperature $T_P$ for the protective layer 27a, a protective layer 27b, and a protective layer 27c is in the range of the well-layer-growth temperature $T_W$ to the first temperature $T_R$. In this embodiment, the growth temperature $T_P$ is equal to the growth temperature $T_W$. The thickness $D_{B2}$ of the barrier layer 29a is larger than the thickness $D_P$ of the protective layer 27a. By reducing the thickness of the protective layer 27a, which does not serve as a well layer or barrier layer, the thickness of the barrier layer 29a may be increased. In this embodiment, the barrier layer 29a is composed of, for example, GaN. The barrier layer 29a has a thickness $D_{B2}$ of, for example, 14 nm. The barrier layer 29a is epitaxially grown on the main surface of the protective layer 27a. Thus, the main surface of the barrier layer 29a is tilted at an angle of 10° to 85° with respect to the c-plane of the gallium nitride-based semiconductor. The surface structure of the well layer 25a is taken over by the surface of the barrier layer 29a.

Figure 4A:
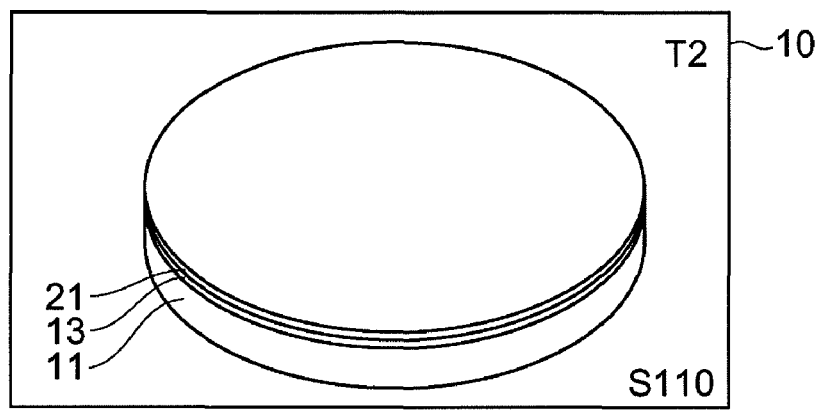
FIGS. 4A and 4B illustrate the main steps in the method for producing a nitride semiconductor optical device and the method for producing an epitaxial wafer according to the embodiment of the present invention.

As shown in FIG. 4A, the active layer 21 is formed in the same way as above. In repetition step S110, a reduction in temperature from the growth temperature $T_B$ to the growth temperature $T_W$ (between times t9 and t11), the growth of a well layer (between times t11 and t12), the growth of a protective layer (between times t12 and t13), an increase in temperature from the growth temperature $T_W$ to the growth temperature $T_B$ (between times t13 and t15), and the growth of the barrier layer (between times t15 and t16) are repeated to complete a quantum well structure. As shown in FIG. 5, the quantum well structure includes the barrier layers 23 and 29a and barrier layers 29b and 29c, the well layer 25a and well layers 25b and 25c, and the protective layer 27a and protective layers 27b and 27c.

Each of the protective layers 27a to 27c may have a thickness $D_P$ of 0.5 nm to 5 nm. Each of the well layers 25a to 25c may have a thickness of 1 nm to 10 nm. Each of the $In_XGa_{1-X}N$ well layers 25a, 25b, and 25c may have an indium composition X of more than 0.01. Each of the $In_XGa_{1-X}N$ well layers 25a, 25b, and 25c may have an indium composition X of less than 0.4. Thus, InGaN having an indium composition within this range can be grown, thereby producing a light-emitting device that emit light with a wavelength of 370 nm to 650 nm. Alternatively, the protective layers 27a to 27c may be composed of GaN, and the barrier layers 23, 29a, 29b, and 29c may be composed of $In_YGa_{1-Y}N$ (indium composition Y: $0 \leq Y \leq 1$, Y represents a strain composition).

Figure 4B:
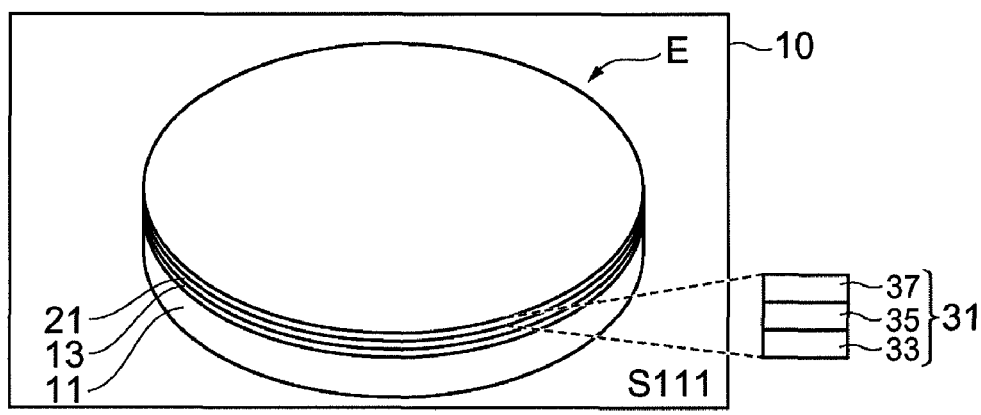

Referring to FIG. 4B, in step S111, a second conductivity-type gallium nitride-based semiconductor region 31 is epitaxially grown on the active layer 21. This growth is performed with the growth furnace. The growth temperature T2 of the second conductivity-type gallium nitride-based semiconductor region 31 is higher than the growth temperature $T_W$ of the well layers 25a to 25c. In a region in which the second conductivity-type gallium nitride-based semiconductor region 31 is grown, for example, an electron blocking layer 33, a first p-type contact layer 35, and a second p-type contact layer 37 may be provided. The electron blocking layer 33 may be composed of, for example, AlGaN. The p-type contact layers 35 and 37 may be composed of p-type GaN. The second p-type contact layer 37 has a dopant concentration $N_{37}$ higher than a dopant concentration $N_{35}$ in the first p-type contact layer 35. In this embodiment, the growth temperature of the electron blocking layer 33 and the p-type contact layers 35 and 37 is, for example, 1,100° C. In the step of depositing the second conductivity-type gallium nitride-based semiconductor region 31, an epitaxial wafer E shown in FIG. 4B is completed. A pair of light guide layers configured to guide light from a semiconductor laser may be grown, as needed. The pair of light guide layers sandwiches the active layer. The light guide layers may be composed of, for example, InGaN or GaN.

The growth rate of the p-type contact layers 35 and 37 is higher than those of the well layers 25a to 25c and the barrier layers 23 and 29a to 29c, thus reducing a period of time required for the growth of the p-type contact layers 35 and 37 performed at a temperature higher than the growth temperature $T_W$ of the well layers 25a to 25c after the formation of the active layer 21.

In the epitaxial wafer E, the first-conductivity-type gallium nitride-based semiconductor region 13, the active layer 21, and the second conductivity-type gallium nitride-based semiconductor region 31 may be arranged in the direction normal to the main surface 11a of the substrate 11. The direction of the c-axis of the hexagonal semiconductor of the substrate 11 differs from the direction normal to the main surface 11a of the substrate 11. The epitaxial growth direction is the direction of the c-axis. The growth direction differs from the stacking direction of the semiconductor layers 13, 21, and 31 stacked in the normal direction.

In the next step, electrodes are formed on the epitaxial wafer E. A first electrode (e.g., an anode electrode) is formed on the contact layer 37. A second electrode (e.g., a cathode electrode) is formed on the undersurface 11b of the substrate.

After the formation of the electrodes, cleavage may be performed along the m-plane or a-plane to form a resonating surface. That is, a semiconductor laser with the m-plane or a-plane formed by cleavage can be produced, the m-plane or a-plane being used as a resonating surface. Furthermore, the angle defined by the direction of the substrate 11 tilted with respect to the c-axis and the direction of the m-axis or a-axis of the gallium nitride-based semiconductor region of the substrate 11 may be in the range of 89° to 91°. In the case where an angle at which the main surface 11a of the substrate is tilted toward the m-axis or a-axis with respect to the c-plane is outside the range of −1° to +1°, the resulting laser has significantly reduced properties. In the case where the direction of tilt of the semipolar main surface 23a of the epitaxial semiconductor region 23 is the same as the direction of the m-plane of the gallium nitride-based semiconductor, the a-plane can be used as the cleavage plane. Alternatively, in the case where the direction of tilt of the semipolar main surface 23a is the same as the direction of the a-plane of the gallium nitride-based semiconductor, the m-plane, which is more readily cleaved, can be used as the cleavage plane.

Figure 6:
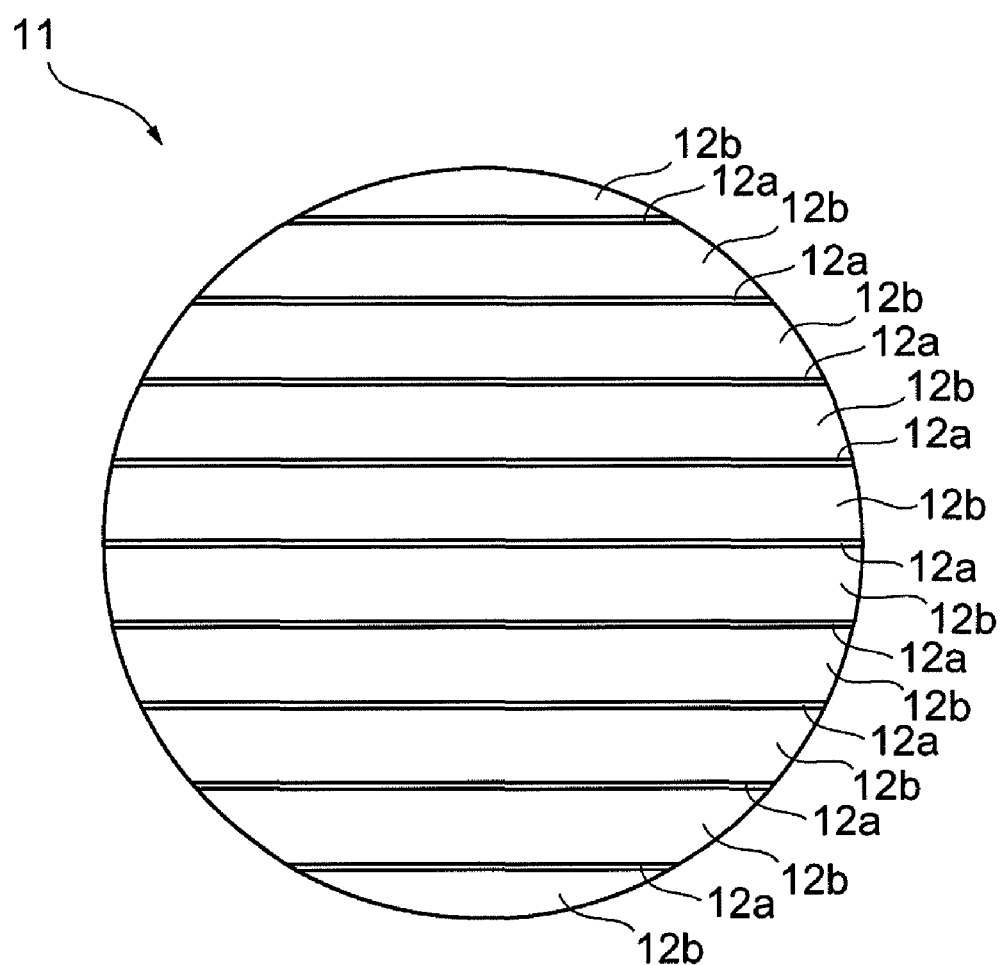
FIG. 6 shows an exemplary structure of a GaN substrate that can be used in an embodiment.

FIG. 6 shows an exemplary structure of a GaN substrate that can be used in an embodiment. The substrate 11 may include a plurality of first regions 12a in which the density of threading dislocations extending to the direction of the c-axis is higher than a first threading dislocation density, and a plurality of second regions 12b in which the density of threading dislocations extending to the direction of the c-axis is lower than the first threading dislocation density. The first regions 12a and the second regions 12b are exposed on the main surface 11a of the substrate 11. On the main surface 11a of the substrate 11, the first regions 12a has a width of, for example, 30 µm, and the second regions 12b has a width of, for example, 370 µm. The first and second regions 12a and 12b are alternately arranged in a predetermined direction. In the case of the substrate is composed of gallium nitride, the predetermined direction may be the direction of the a-axis of gallium nitride constituting the substrate.

Each of the first regions 12a is a semiconductor portion of a defect-rich region with a high dislocation density. Each of the second regions 12b is a semiconductor portion of a low-defect region with a low dislocation density. In the case of producing a nitride semiconductor light-emitting device in the region with a low-dislocation density of the substrate 11, the resulting light-emitting device has improved luminous efficiency and reliability. A threading dislocation density of the second regions 12b of less than $1\times10^7$ cm$^{-2}$ results in a semiconductor laser with practically sufficient reliability.

Example 1

Off Angle

Examples of this embodiment will be described below. A light-emitting diode (LED) was produced by metalorganic vapor phase epitaxy. Trimethylgallium (TMG), trimethylindium (TMI), trimethylaluminum (TMA), and ammonia were used as a gallium source, an indium source, an aluminum source, and a nitrogen source, respectively, used in metalorganic vapor phase epitaxy. SiH$_4$ and Cp$_2$Mg were used as an n-type dopant and a p-type dopant, respectively. FIG. 7 shows main production conditions. A GaN wafer 41 was prepared.

Figure 8:
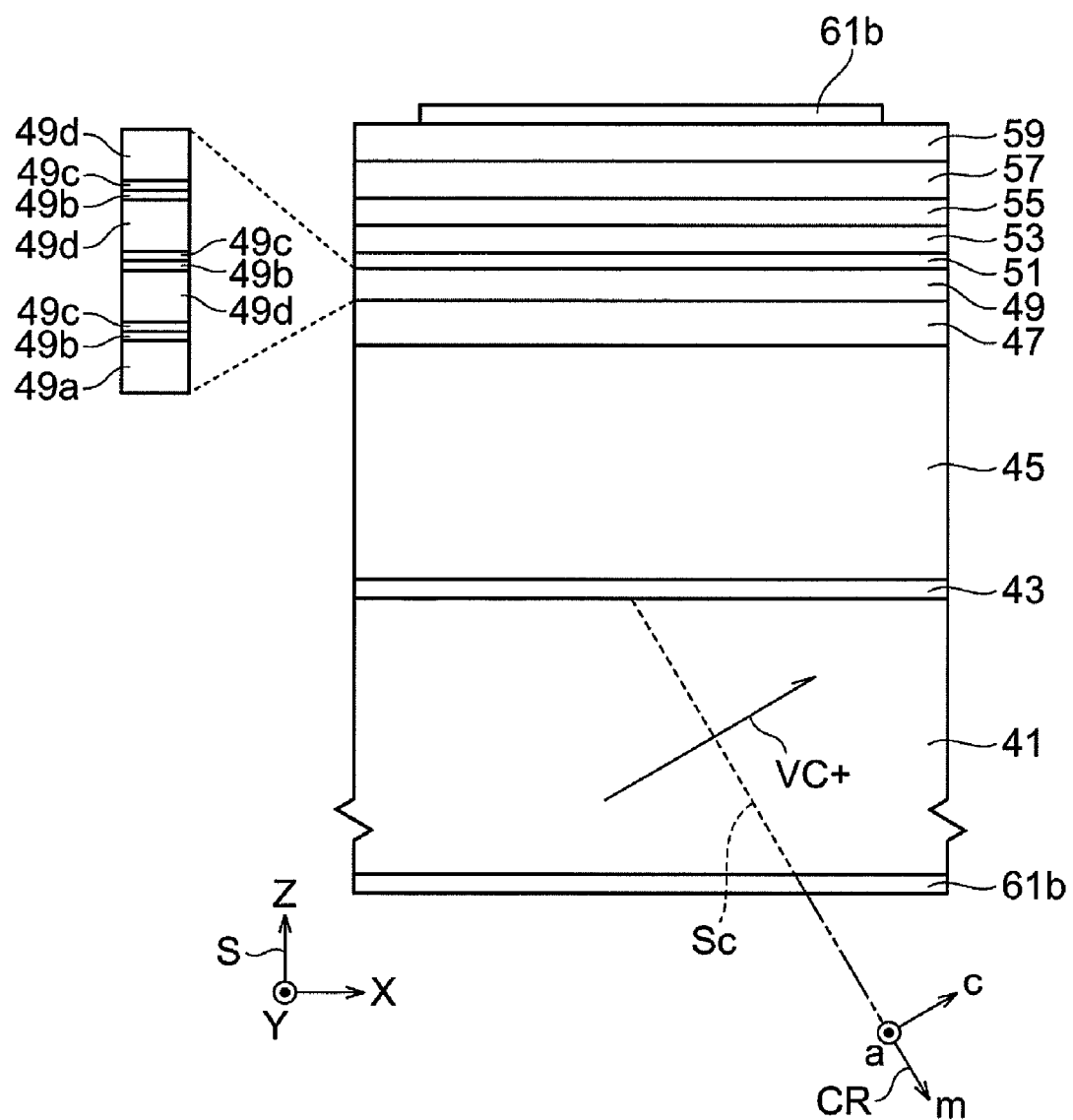
FIG. 8 shows a structure of a light-emitting diode in Example 1.

The production of the structure of the LED will be described below with reference to FIGS. 7 and 8. A main surface of the GaN wafer 41 was tilted at an angle of 75° with respect to the c-plane of the GaN wafer 41. After the GaN wafer 41 was placed in a growth furnace, heat treatment was performed in an atmosphere containing ammonia and hydrogen. The heat treatment temperature was 1,050° C. The heat treatment time was about 10 minutes.

After the heat treatment, TMG (24.4 µmol/min), TMA (4.3 µmol/min), NH$_3$ (5 slm), and SiH$_4$ were fed into the growth furnace to grow an n-type AlGaN layer 43 on the GaN wafer 41 at 1,100° C. The n-type AlGaN layer 43 had a thickness of 50 nm. The growth rate of the n-type AlGaN layer 43 was 9.8 nm/min. The n-type AlGaN layer 43 had an Al composition of 0.12. Then TMG (243.8 µmol/min), NH$_3$ (7.5 slm), and SiH$_4$ were fed into the growth furnace to grow an n-type GaN layer 45 on the n-type AlGaN layer 43 at 950° C. The n-type GaN layer 45 had a thickness of 2,000 nm. The growth rate of the n-type GaN layer 45 was 129.6 nm/min.

TMG (24.4 µmol/min), TMI (2.1 µmol/min), NH$_3$ (6 slm), and SiH$_4$ were fed into the growth furnace to grow an n-type InGaN layer 47 on the n-type GaN layer 45 at 840° C. The n-type InGaN layer 47 had a thickness of 100 nm. The growth rate of the n-type InGaN layer 47 was 6.7 nm/min. The n-type InGaN layer 47 had an In composition of 0.02.

Then active layer 49 was grown. TMG (24.4 µmol/min) and NH$_3$ (6 slm) were fed into the growth furnace to grow an undoped GaN layer 49a on the n-type InGaN layer 47 at 870° C. The undoped GaN layer 49a had a thickness of 15 nm. The growth rate of the undoped GaN layer 49a was 6.7 nm/min.

Next, the temperature in the growth furnace was changed from 870° C. to 745° C. TMG (15.6 µmol/min), TMI (58.0 µmol/min), and NH$_3$ (8 slm) were fed into the growth furnace to grow an undoped InGaN layer 49b on the undoped GaN layer 49a at 745° C. The undoped InGaN layer 49b had a thickness of 2.5 nm. The growth rate of the undoped InGaN layer 49b was 3.6 nm/min. The undoped InGaN layer 49b had an In composition of 0.20.

TMG (15.6 µmol/min) and NH$_3$ (8 slm) were fed into the growth furnace while the temperature in the growth furnace was maintained at 745° C., growing an undoped GaN layer 49c on the undoped InGaN layer 49b at 745° C. The GaN layer 49c had a thickness of 1 nm. The growth rate of the GaN layer 49c was, for example, 3.6 nm/min.

After the growth of the undoped GaN layer 49c, the temperature in the growth furnace was changed from 745° C. to 870° C. Then TMG (24.4 µmol/min) and NH$_3$ (6 slm) were fed into the growth furnace to grow an undoped GaN layer 49d on the undoped GaN layer 49c at 870° C. The GaN layer 49d had a thickness of 14 nm. The growth rate of the GaN layer 49d was 6.7 nm/min.

The repetition of the growth of the well layer 49b, the protective layer 49c, and the barrier layer 49d resulted in the active layer 49. Then TMG (13.0 µmol/min) and NH$_3$ (6 slm) were fed into the growth furnace to grow an undoped GaN layer (N$_2$—GaN layer) 51 on the active layer 49 at 870° C. The GaN layer 51 had a thickness of 3 nm. The growth rate of the GaN layer 51 was 4.5 nm/min. Next, TMG (98.7 µmol/min) and NH$_3$ (5 slm) were fed into the growth furnace to grow an undoped GaN layer 53 on the GaN layer 51 at 1,100° C. The GaN layer 53 had a thickness of 10 nm. The growth rate of the GaN layer 53 was 60.0 nm/min.

Subsequently, TMG (24.4 µmol/min), TMA (2.3 µmol/min), NH$_3$ (6 slm), and Cp$_2$Mg were fed into the growth furnace to grow a p-type AlGaN layer 55 on the GaN layer 53 at 1,100° C. The AlGaN layer 55 had a thickness of 20 nm. The growth rate of the AlGaN layer 55 was 5.9 nm/min. The p-type AlGaN layer 55 had an Al composition of 0.07.

TMG (98.7 µmol/min), NH$_3$ (5 slm), and Cp$_2$Mg were fed into the growth furnace to grow a p-type GaN layer 57 on the p-type AlGaN layer 55 at 1,100° C. The p-type GaN layer 57 had a thickness of 25 nm. The growth rate of the GaN layer 57 was 58.2 nm/min.

Then TMG (67.0 µmol/min), NH$_3$ (5 slm), and Cp$_2$Mg were fed into the growth furnace to grow a p-type GaN layer 59 on the p-type GaN layer 57 at 1,100° C. The p-type GaN layer 59 had a thickness of 25 nm. The growth rate of the GaN layer 59 was 36.3 nm/min.

These steps were performed to produce an epitaxial wafer. An anode 61a and a cathode 61b were formed on the epitaxial wafer. Thereby, an LED shown in FIG. 8 was produced. FIG. 8 shows the c-plane Sc with an off-angle of 75°, a crystal coordinate system CR indicated by the c-axis, the a-axis, and the m-axis, and a position coordinate system S indicated by the X-axis, the Y-axis, and the Z-axis. The Z-axis indicates the stacking direction of the semiconductor layers and differs from the direction of the c-axis.

A sapphire (0001) substrate was prepared separately from the GaN wafer 41. The same stack semiconductor structure as the structure of the epitaxial wafer using the GaN wafer was formed on the sapphire substrate under proper production conditions. Main production conditions for an epitaxial wafer using the sapphire substrate will be described below. After the sapphire substrate was placed in the growth furnace, heat treatment was performed in a hydrogen atmosphere. The heat treatment temperature was 1,100° C. The heat treatment time was about 10 minutes. After the heat treatment, TMG (49 μmol/min) and $NH_3$ (5 slm) were fed into the growth furnace to grow an undoped GaN layer on the sapphire substrate at 500° C. Then TMG (243.8 μmol/min), $NH_3$ (5.0 slm), and $SiH_4$ were fed into the growth furnace to grow an n-type GaN layer on the undoped GaN layer at 950° C. The n-type GaN layer had a thickness of 5,000 nm. The growth rate of the n-type GaN layer was 129.6 nm/min. Well layers and protective layers were grown at 760° C. Other production conditions were the same as the conditions for the GaN substrate.

Figure 9:
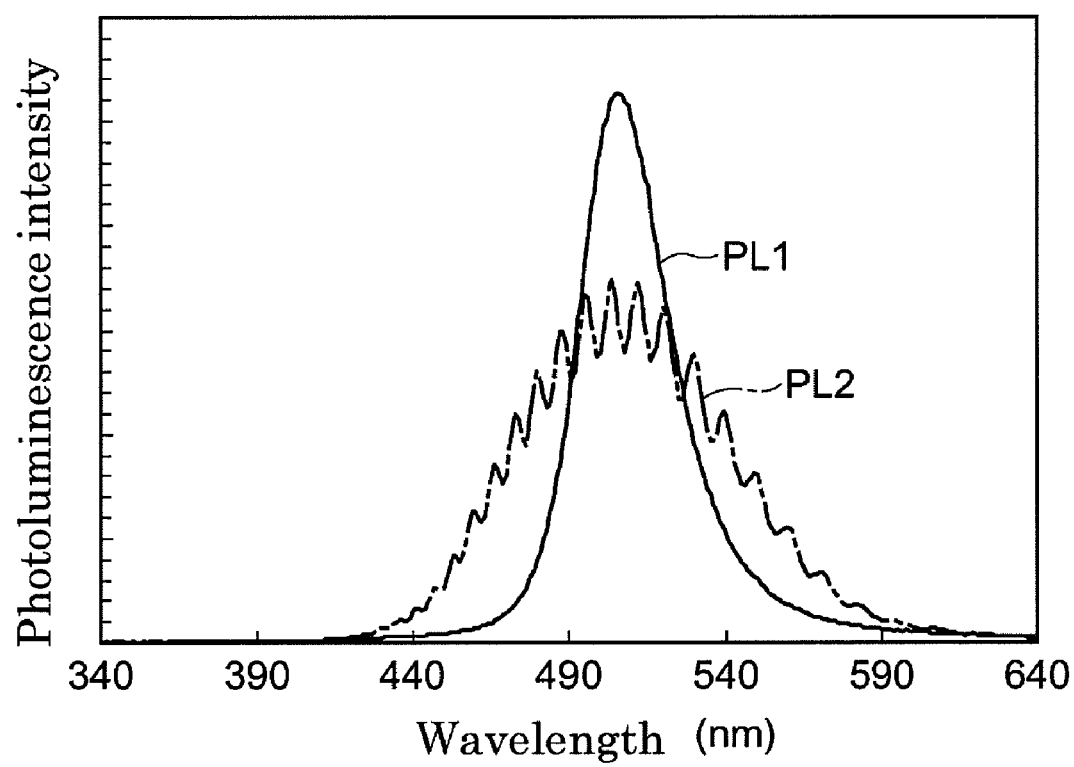
FIG. 9 is a graph showing PL spectra in Example 1.

The epitaxial wafer using the GaN wafer and the epitaxial wafer using the sapphire substrate have the same structure in that each of the protective layers having a small thickness (of about 1 nm) is arranged on a corresponding one of the well layers. The well layers of these epitaxial wafers, however, differ from each other in that each of the well layers of the epitaxial wafer using the GaN wafer has the semipolar surface (off-angle 75°), and each of the well layers of the epitaxial wafer using the sapphire substrate has the c-plane surface. Photoluminescence (PL) spectra of these epitaxial wafers were measured. FIG. 9 shows PL spectra PL1 and PL2 of light-emitting devices produced under representative conditions. These PL spectra and the formation conditions of the well layers are shown below.

| PL | Growth temperature $T_W$ (° C.) | Growth temperature $T_P$ (° C.) | Full width at half maximum (nm) | Peak wavelength (nm) |
|---|---|---|---|---|
| PL1 (semipolar) | 745 | 745 | 34 | 508 |
| PL2 (c-plane) | 760 | 760 | 79 | 507 |

In the growth method according to this embodiment, the results shown in FIG. 9 demonstrated that the protective layers had a small thickness and thus a weak effect of protecting the well layers during temperature increase. In the well layers provided on the c-plane, thus, the semiconductor crystal was decomposed, thereby increasing the full width at half maximum of the PL spectrum. In contrast, the well layers arranged on the GaN wafer with an off-angle of 75° were not readily decomposed compared with the well layers provided on the c-plane and exhibited satisfactory luminescence properties.

Example 2

Laser Structure

A GaN wafer 41 was prepared. After the GaN wafer 41 was placed in a growth furnace, heat treatment was performed in an atmosphere containing ammonia and hydrogen. The heat treatment temperature was 1,100° C. The heat treatment time was about 10 minutes.

FIG. 10 shows main production conditions.

After the heat treatment, TMG (98.7 μmol/min), TMA (8.2 μmol/min), $NH_3$ (6 slm), and $SiH_4$ were fed into the growth furnace to grow an n-type AlGaN layer 81 for a cladding layer on the GaN wafer 41 at 1,150° C. The n-type AlGaN layer 81 had a thickness of 2,000 nm. The growth rate of the n-type AlGaN layer 81 was 46.0 nm/min. The n-type AlGaN layer 81 had an Al composition of 0.04.

Then TMG (98.7 μmol/min), $NH_3$ (5 slm), and $SiH_4$ were fed into the growth furnace to grow an n-type GaN layer 83 on the n-type AlGaN layer 81 at 1,150° C. The n-type GaN layer 83 had a thickness of 50 nm. The growth rate of the n-type GaN layer 83 was 58.0 nm/min.

TMG (24.4 mol/min), TMI (4.6 μmol/min), and $NH_3$ (6 slm) were fed into the growth furnace to grow an undoped InGaN layer 85a for a light guide layer on the n-type GaN layer 83 at 840° C. The undoped InGaN layer 85a had a thickness of 50 nm. The growth rate of the undoped InGaN layer 85a was 6.7 nm/min. The undoped InGaN layer 85a had an In composition of 0.05.

An active layer 87 was then grown. TMG (24.4 μmol/min), TMI (1.6 μmol/min), and $NH_3$ (6 slm) were fed into the growth furnace to grow an undoped InGaN layer 87a for a barrier layer on the undoped InGaN layer 85a at 870° C. The undoped InGaN layer 87a had a thickness of 15 nm. The growth rate of the undoped InGaN layer 87a was 6.7 nm/min. The undoped InGaN layer 87a had an In composition of 0.01.

Next, the temperature in the growth furnace was changed from 870° C. to 745° C. TMG (15.6 μmol/min), TMI (29.0 μmol/min), and $NH_3$ (8 slm) were fed into the growth furnace to grow an undoped InGaN layer 87b on the undoped InGaN layer 87a at 745° C. The undoped InGaN layer 87b had a thickness of 3 nm. The growth rate of the undoped InGaN layer 87b was 3.1 nm/min. The undoped InGaN layer 87b had an In composition of 0.25.

TMG (15.6 μmol/min), TMI (0.3 μmol/min), and $NH_3$ (8 slm) were fed into the growth furnace while the temperature in the growth furnace was maintained at 745° C., growing an undoped InGaN layer 87c on the undoped InGaN layer 87b at 745° C. The undoped InGaN layer 87c had a thickness of 1 nm. The growth rate of the undoped InGaN layer 87c was 3.1 nm/min.

After the growth of the undoped InGaN layer 87c, the temperature in the growth furnace was changed from 745° C. to 870° C. Then TMG (24.4 μmol/min), TMI (1.6 μmol/min), and $NH_3$ (6 slm) were fed into the growth furnace to grow an undoped InGaN layer 87d on the undoped InGaN layer 87c at 870° C. The undoped InGaN layer 87d had a thickness of 14 nm. The growth rate of the undoped InGaN layer 87d was 6.7 nm/min.

The repetition of the growth of the well layer 87b, the protective layer 87c, and the barrier layer 87d resulted in the active layer 87. Then TMG (24.4 μmol/min), TMI (4.6 μmol/min), and $NH_3$ (6 slm) were fed into the growth furnace to grow an undoped InGaN layer 85b for a light guide layer on the active layer 87 at 840° C. The undoped InGaN layer 85b had a thickness of 50 nm. The growth rate of the undoped InGaN layer 85b was 6.7 nm/min. Next, TMG (98.7 μmol/min) and $NH_3$ (5 slm) were fed into the growth furnace to grow an undoped GaN layer (undoped GaN layer) 89 on the undoped InGaN layer 85b at 1,100° C. The undoped GaN layer 89 had a thickness of 50 nm. The growth rate of the GaN layer 89 was 58.0 nm/min.

Subsequently, TMG (16.6 µmol/min), TMA (2.8 µmol/min), NH$_3$ (6 slm), and Cp$_2$Mg were fed into the growth furnace to grow a p-type AlGaN layer 91 on the undoped GaN layer 89 at 1,100° C. The p-type AlGaN layer 91 had a thickness of 20 nm. The growth rate of the p-type AlGaN layer 91 was 4.9 nm/min. The p-type AlGaN layer 91 had an Al composition of 0.18.

TMG (36.6 µmol/min), TMA (3.0 µmol/min), NH$_3$ (6 slm), and Cp$_2$Mg were fed into the growth furnace to grow a p-type AlGaN layer 93 on the p-type AlGaN layer 91 at 1,100° C. The AlGaN layer 93 had a thickness of 400 nm. The growth rate of the AlGaN layer 93 was 13.0 nm/min. Then TMG (34.1 µmol/min), NH$_3$ (5 slm), and Cp$_2$Mg were fed into the growth furnace to grow a p-type GaN layer 95 on the p-type AlGaN layer 93 at 1,100° C. The p-type GaN layer 95 had a thickness of 50 nm. The growth rate of the p-type GaN layer 95 was 18.0 nm/min. These steps were performed to produce an epitaxial wafer. An anode 97a and a cathode 97b were formed on the epitaxial wafer.

Figure 11:
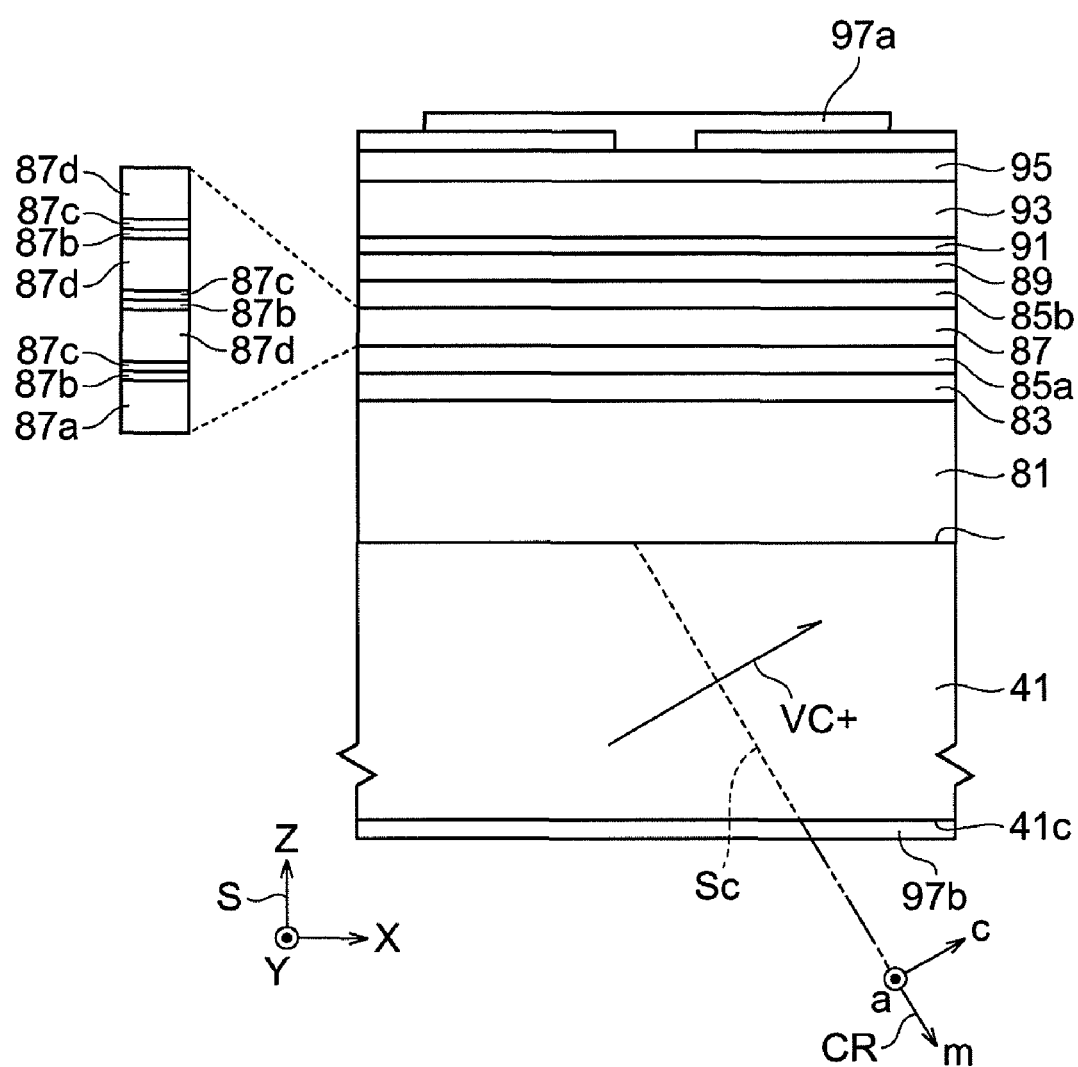
FIG. 11 shows a structure of a laser diode in Example 2.

A semiconductor diode shown in FIG. 11 was produced through the steps described above. The anode 97a was electrically connected to the p-type GaN layer 95 with an insulating film provided therebetween, the insulating film having a strip window with a width of 10 µm. The anode 97a was composed of Ni/Au. The cathode 97b was composed of Ti/Al/Au. FIG. 11 shows the c-plane Sc with an off-angle of 75°, a crystal coordinate system CR indicated by the c-axis, the a-axis, and the m-axis, and a position coordinate system S indicated by the X-axis, the Y-axis, and the Z-axis. The Z-axis indicates the stacking direction of the semiconductor layers and differs from the direction of the c-axis. Cleavage was performed along the a-plane to form a laser bar with a length of 600 µm. The oscillation wavelength was 520 nm. The threshold current was 900 mA.

Second Embodiment

Figure 12:
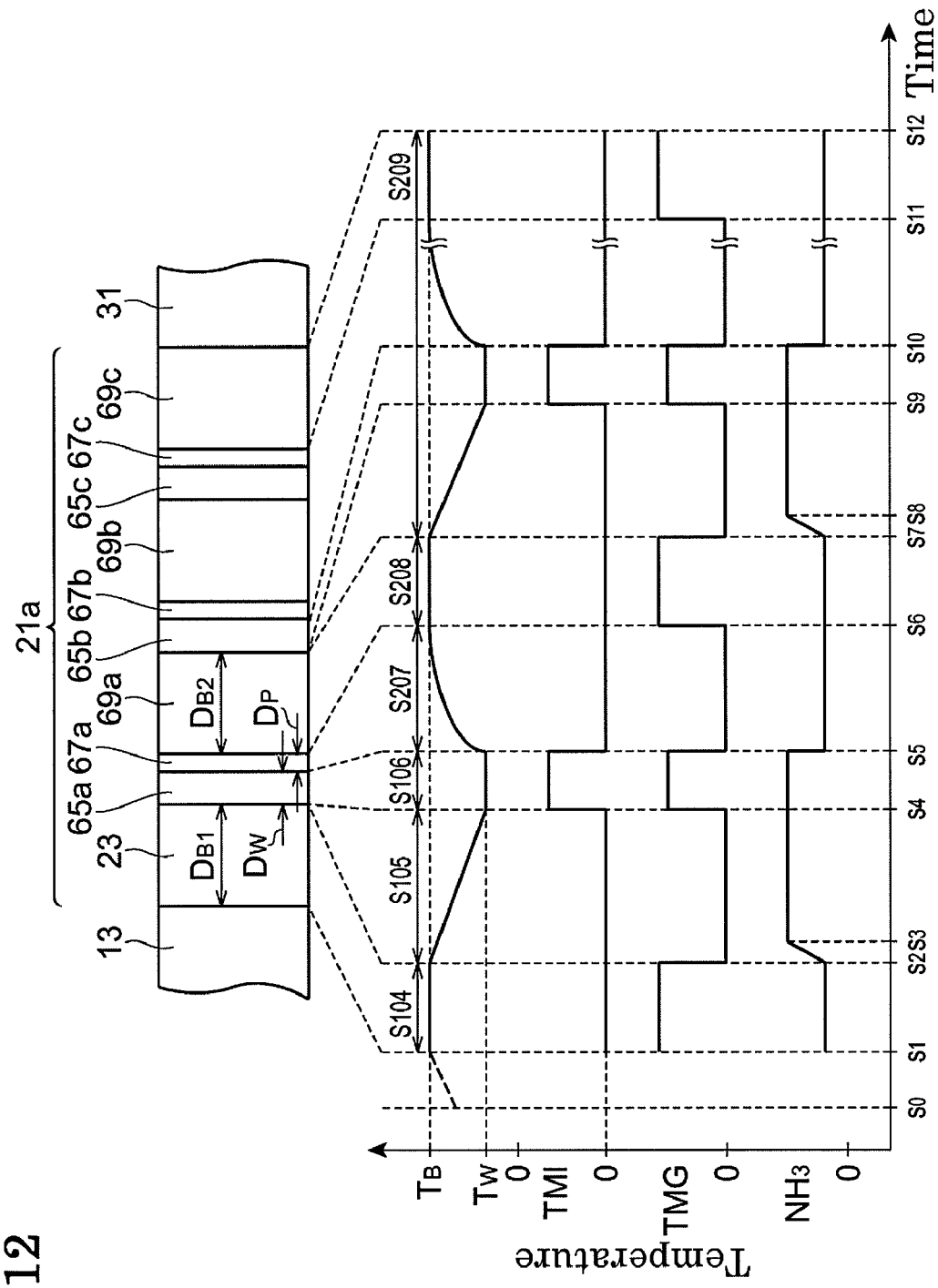
FIG. 12 is a time chart showing the flow of raw-material gases and a change in temperature in a growth furnace during the formation of an active layer according to a second embodiment.

Referring to FIG. 12, FIG. 12 is a time chart showing the flow of raw-material gases and a change in temperature in the growth furnace during the formation of the active layer. In this embodiment, an active layer 21a of a nitride semiconductor light-emitting device is formed. A process of forming the quantum well structure of the active layer 21a will be described in detail below with reference to the attached drawings.

The temperature of the growth furnace means a temperature of a component, such as a susceptor, in the growth furnace. At time s0, the deposition of a gallium nitride-based semiconductor that will be overlaid with the active layer is completed. The temperature in the growth furnace 10 is changed to a temperature at which a semiconductor constituting the active layer is grown, between times s0 and s1. Like the first embodiment, in step S104, an epitaxial semiconductor region 23 composed of a gallium nitride-based semiconductor is formed at a growth temperature T$_B$ between times s1 and s2. The GaN barrier layer D$_{B1}$ has a thickness of, for example, 15 nm. The surface structure of the main surface 13a is taken over by the surface of the epitaxial semiconductor region 23. At time s2, the supply of the gallium source is stopped to terminate the deposition of the gallium nitride-based semiconductor. In step S105, the temperature in the growth furnace is changed from the growth temperature T$_B$ to a growth temperature T$_W$ before the growth of the well layer.

The temperature is changed between times t2 and t4. In the case where the amount of a nitrogen source supplied for the growth of the barrier layer is different from the amount of the nitrogen source supplied for the growth of the well layer, the amount of the nitrogen source supplied is changed to the amount of the nitrogen source supplied for the growth of the well layer between times s2 and s3. At time s4, the temperature in the growth furnace 10 reaches the growth temperature T$_W$ of the well layer. Like the first embodiment, in step S106, a well layer 65a for the quantum well structure is grown on the semipolar main surface 23a between times s4 and s5 while the temperature in the growth furnace 10 is maintained at the growth temperature T$_W$ of the well layer. The well layer 65a is epitaxially grown on the main surface of the epitaxial semiconductor region 23. Thus, the surface structure of the epitaxial semiconductor region 23 is taken over by the surface of the well layer 65a. The tilt angle of the main surface of the well layer 65a reflects the tilt angle of the main surface of the epitaxial semiconductor region 23 and is in the range of 10° to 85° with respect to the c-plane of the gallium nitride-based semiconductor. The InGaN well layer has a thickness D$_W$ of, for example, 4 nm.

At time s5, the growth of the well layer 65a is completed. In step S207, the temperature is changed from the growth temperature T$_W$ to a growth temperature T$_B$ of a second barrier layer 69a. This temperature increase is performed between, for example, times s5 and s6. To prevent the deterioration of the well layer 65a during the temperature increase, a protective layer 67a is grown so as to cover the surface of the well layer 65a. Immediately after the completion of the growth of the well layer 65a, the growth of the protective layer 67a is initiated so as to cover the well layer 65a. The temperature change during the growth of the protective layer 67a is performed by reducing the rate of temperature increase with time, so that the temperature profile curve between times s5 and s6 is convex upward. According to this heating profile, a period of time required to increase the temperature to growth temperature T$_B$ and then stabilize the temperature is reduced, thereby preventing the deterioration of the well layer.

Like the protective layer 27a, the protective layer 67a is composed of a gallium nitride-based semiconductor having a higher band gap energy than the material constituting the well layer 65a. The protective layer 67a composed of the gallium nitride-based semiconductor described above is epitaxially grown over a period between times s5 and s6. The protective layer 67a has a smaller thickness than the barrier layer 69a. Furthermore, the protective layer 67a has a smaller thickness than the well layer 65a. The protective layer 67a is grown at a growth rate lower than that of the barrier layer 69a. For example, the growth rate is adjusted by reducing the amount of the gallium source supplied and the amount of the nitrogen source supplied between times s5 and s6. In this embodiment, the protective layer 67a is composed of GaN, which is a material the same as that constituting the epitaxial semiconductor region 23. The protective layer 67a may be composed of GaN, and the barrier layer 23 may be composed of In$_Y$Ga$_{1-Y}$N (indium composition Y: 0≦Y<1, Y represents a strain composition). The protective layer 67a has a thickness D$_P$ of, for example, 2.5 nm. The protective layer 67a is epitaxially grown on the main surface of the well layer 65a. Thus, the surface structure of the well layer 65a is taken over by the surface of the protective layer 67a.

In step S208, the barrier layer 69a is grown subsequent to the growth of the protective layer 67a. At time s6, the increase in temperature in the growth furnace 10 is completed. After the growth of the protective layer 27a, the barrier layer 69a composed of a gallium nitride-based semiconductor is grown between times s6 and s7 while the temperature in the growth furnace 10 is maintained at the growth temperature T$_B$. The growth temperature T$_B$ is equal to or higher than the first temperature $T_R$ that enables the barrier layer having satisfactory crystalline quality to grow. The growth temperature $T_P$ for the protective layers 67a to 67c is in the range of the well-layer-growth temperature $T_W$ to the first temperature $T_R$. In this embodiment, the growth temperature $T_P$ of the protective layers 67a to 67c is higher than the growth temperature $T_W$. Each of the thickness $D_{B2}$ of the second barrier layer 69a and the thickness $D_W$ of the well layer 65a is larger than the thickness $D_P$ of the protective layer 67a. By reducing the thickness of the protective layer 67a, which does not serve as a well layer or barrier layer, the thickness of the barrier layer 69a may be increased. In this embodiment, the barrier layer 69a is composed of, for example, GaN. The barrier layer 69a has a thickness $D_{B2}$ of, for example, 12.5 nm. The barrier layer 69a is epitaxially grown on the main surface of the protective layer 67a. Thus, the surface structure of the well layer 65a is taken over by the surface of the barrier layer 69a.

As shown in FIG. 12, the formation of the active layer 21a is continued in the same way as above. In step S209, a reduction in temperature from the growth temperature $T_B$ to the growth temperature $T_W$ (between times t7 and t9), the growth of a well layer (between times t9 and t10), an increase in temperature from the growth temperature $T_W$ to the growth temperature $T_B$ and the growth of a protective layer (between times s10 and s10), and the growth of the barrier layer (between times s11 and s12) are repeated to complete a quantum well structure. As shown in FIG. 12, the quantum well structure includes the barrier layers 23 and 69a and barrier layers 69b and 69c, the well layer 65a and well layers 65b and 65c, and the protective layer 67a and protective layers 67b and 67c. Each of the protective layers 67a to 67c has a thickness $D_P$ of, for example, 0.5 nm to 5 nm.

According to this method, immediately after the completion of the growth of the well layer 65a, the protective layer 67a is grown. The growth is performed while the temperature in the growth furnace 10 is being increased from the growth temperature $T_W$ to the growth temperature $T_B$. The temperature in the growth furnace 10 is increased while the protective layers 67a to 67c are being grown. Thus, the semiconductor crystals constituting the well layers 65a to 65c having semipolar main surfaces are not readily decomposed compared with the well layer grown on the c-plane main surface. Furthermore, the protective layers 67a to 67c are grown while the temperature is being increased, thus reducing the period for which the well layers 65a to 65c are exposed to a high temperature.

According to the first embodiment, immediately after the completion of the growth of the well layers 25a to 25c, the thin protective layer 27a to 27c are grown at the same temperature as the well-layer-growth temperature $T_W$. The protective layer 67a grown at a relatively low temperature can protect the well layer 65a. Thus, whether or not the protective layer is grown in the latter half of the temperature-rise period, the protective layer shows the protective effect.

For example, the protective layer may be grown while the temperature in the growth furnace 10 is being increased from the growth temperature $T_W$ to an intermediate temperature $T_M$ that is lower than the growth temperature $T_B$. This method may further include after the growth of the protective layer, a step of increasing the temperature in the growth furnace 10 from the intermediate temperature $T_M$ to the growth temperature $T_B$ without growing a gallium nitride-based semiconductor. In this temperature profile, the average heating rate from the growth temperature $T_W$ to the intermediate temperature $T_M$ is higher than the average heating rate from the intermediate temperature $T_M$ to the growth temperature $T_B$. According to this method, the rate of temperature change is high during the period for which the protective layer is grown. Thus, the growth temperature of the protective layer increases with time, providing the protective layer with satisfactory crystalline quality.

Example 3

Off Angle: 75°

A GaN wafer was prepared. A main surface of the GaN wafer was tilted at an angle of 75° with respect to the c-plane of the GaN wafer. After the GaN wafer was placed in a growth furnace, heat treatment was performed in an atmosphere containing ammonia and hydrogen. The heat treatment temperature was 1,050° C. The heat treatment time was about 10 minutes. The same production conditions as those shown in FIG. 7 were used, except for growth conditions of the active layer.

The growth conditions of the active layer were described below. TMG (24.4 µmol/min) and NH₃ (6 slm) were fed into the growth furnace to grow an undoped GaN layer (barrier layer) on an n-type InGaN layer at 860° C. The GaN barrier layer had a thickness of 15 nm. The growth rate of the GaN layer was 6.7 nm/min.

Next, the temperature in the growth furnace was changed from 860° C. to 750° C. After the completion of the temperature change, TMG (15.6 µmol/min), TMI (58.0 µmol/min), and NH₃ (8 slm) were fed into the growth furnace to grow an undoped InGaN layer (well layer) on the GaN barrier layer at 750° C. The InGaN layer had a thickness of 4 nm. The growth rate of the InGaN well layer was 5 nm/min. The n-type InGaN well layer 47 had an In composition of 0.20.

After the growth of the InGaN well layer, TMG (24.4 µmol/min) and NH₃ (6 slm) were fed into the growth furnace to grow a GaN protective layer while the temperature in the growth furnace was being increased from 750° C. to 860° C. The GaN protective layer had a thickness of 2.5 nm. The average growth rate of the GaN protective layer was 0.8 nm/min.

After the growth of the GaN protective layer, TMG (24.4 µmol/min) and NH₃ (6 slm) were fed into the growth furnace to grow a GaN barrier layer while the temperature in the growth furnace was maintained at 860° C. The GaN barrier layer had a thickness of 12.5 nm. The average growth rate of the GaN barrier layer was 6.7 nm/min.

The repetition of the growth of the InGaN well layer, the GaN protective layer, and the GaN barrier layer resulted in the active layer. Then a p-type gallium nitride-based semiconductor region was deposited as in Example 1.

Like the Example 1, a sapphire (0001) substrate was prepared separately from the GaN wafer. The same stack semiconductor structure as the structure of the epitaxial wafer using the GaN wafer was formed on the sapphire substrate under proper production conditions. Main production conditions for an epitaxial wafer using the sapphire substrate will be described below. After the sapphire substrate was placed in the growth furnace, heat treatment was performed in a hydrogen atmosphere. The heat treatment temperature was 1,100° C. The heat treatment time was about 10 minutes. After the heat treatment, TMG (49 µmol/min) and NH₃ (5 slm) were fed into the growth furnace to grow an undoped GaN layer on the sapphire substrate at 5000C. Then TMG (243.8 µmol/min), NH₃ (5.0 slm), and SiH₄ were fed into the growth furnace to grow an n-type GaN layer on the undoped GaN layer at 950° C. The n-type GaN layer had a thickness of 5,000 nm. The growth rate of the n-type GaN layer was 129.6 nm/min. Well layers were grown at 760° C. Other production conditions were the same as the conditions for the GaN substrate.

Figure 13A:
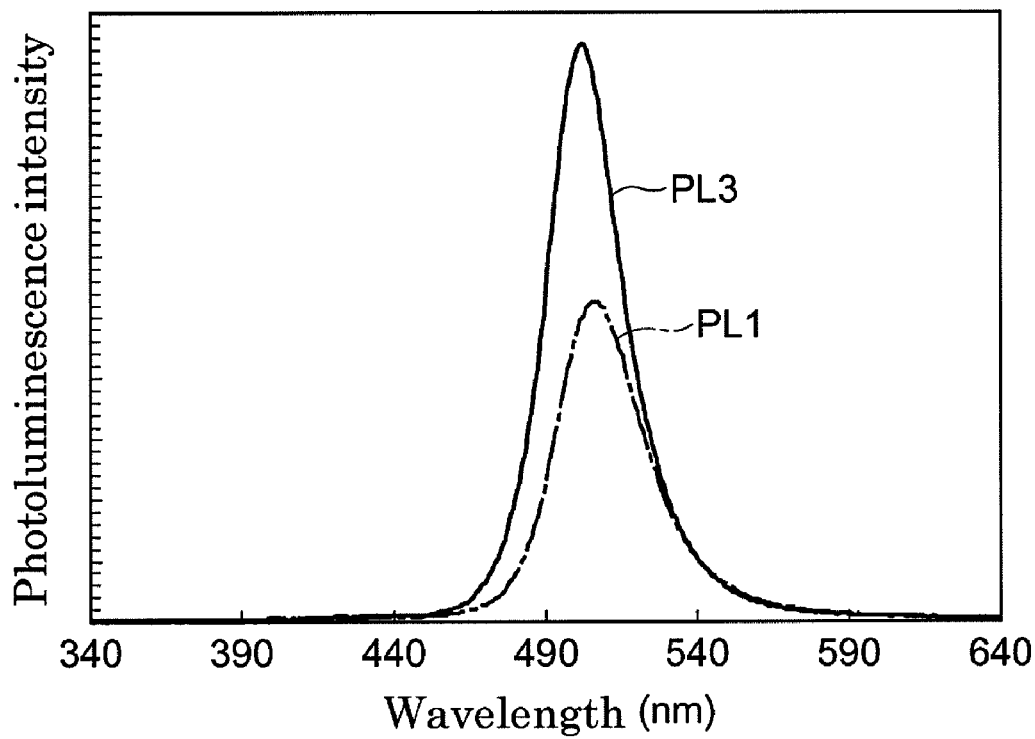
FIGS. 13A and 13B are graphs showing PL spectra in Example 3.
Figure 13B:
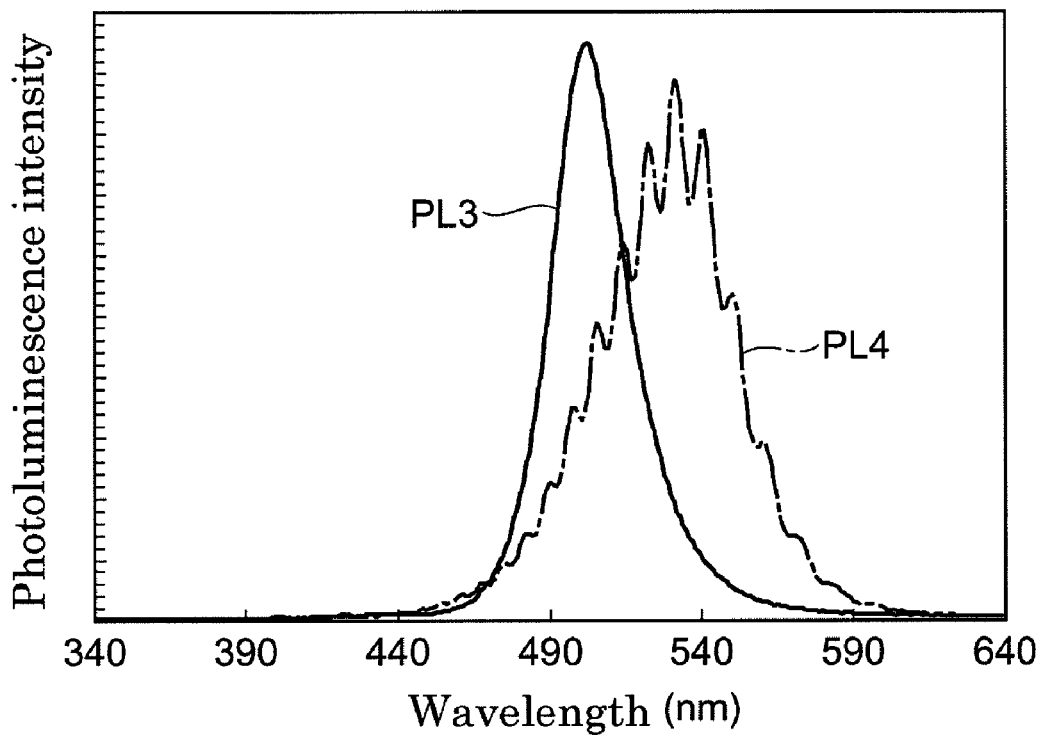

The epitaxial wafer using the GaN wafer and the epitaxial wafer using the sapphire substrate have the same structure in that the protective layers (with a thickness of 2.5 nm) grown over the temperature-rise periods were arranged on the respective well layers. The well layers of these epitaxial wafers, however, differ from each other in that each of the well layers of the epitaxial wafer using the GaN wafer has the semipolar surface (off-angle 75°), and each of the well layers of the epitaxial wafer using the sapphire substrate has the c-plane surface. Photoluminescence (PL) spectra of these epitaxial wafers were measured. FIGS. 13A and 13B show PL spectra PL3 and PL4 of light-emitting devices produced under representative conditions. These PL spectra and the formation conditions of the well layers are shown below.

| PL | Growth temperature $T_W$ (° C.) | Growth temperature $T_P$ (° C.) | Full width at half maximum (nm) | Peak wavelength (nm) |
|---|---|---|---|---|
| PL3 (semipolar) | 750 | With temperature rising | 30 | 503 |
| PL4 (c-plane) | 760 | With temperature rising | 53 | 529 |

Referring to FIG. 13A, in the growth method according to this Example, the comparison between PL1 and PL3 showed that an increase in the thickness of the protective layers improved a protective effect against the increase in temperature.

The full width at half maximum of PL3 was smaller than that of PL1. The shape of the PL spectrum of PL3 was sharper than that of PL1. Furthermore, the PL intensity of PL3 was increased. Referring to FIG. 13B, the comparison between PL3 and PL4 showed that the semiconductor crystals constituting the well layers arranged on the c-plane were decomposed to increase the full width at half maximum of the PL spectrum. In contrast, the semiconductor crystals constituting the well layers arranged on the GaN wafer with an off-angle of 75° were not readily decomposed compared with the well layers arranged on the c-plane and exhibited satisfactory luminescence properties.

Example 4

Off Angle: 58°

A GaN wafer was prepared. A main surface of the GaN wafer was tilted at an angle of 58° with respect to the c-plane of the GaN wafer. After the GaN wafer was placed in a growth furnace, heat treatment was performed in an atmosphere containing ammonia and hydrogen. The heat treatment temperature was 1,050° C. The heat treatment time was about 10 minutes. The same production conditions as those shown in FIG. 7 were used, except for growth conditions of the active layer.

The growth conditions of the active layer were described below. TMG (24.4 µmol/min) and NH₃ (6 slm) were fed into the growth furnace to grow an undoped GaN layer (barrier layer) on an n-type InGaN layer at 860° C. The GaN barrier layer had a thickness of 15 nm. The growth rate of the GaN layer was 6.7 nm/min.

Next, the temperature in the growth furnace was changed from 860° C. to 770° C. After the completion of the temperature change, TMG (15.6 µmol/min), TMI (29.0 µmol/min), and NH₃ (8 slm) were fed into the growth furnace to grow an undoped InGaN layer (well layer) on the GaN barrier layer at 770° C. The InGaN layer had a thickness of 2.7 nm. The growth rate of the InGaN well layer was 5 nm/min. The n-type InGaN layer 47 had an In composition of 0.20.

After the growth of the InGaN well layer, TMG (24.4 µmol/min) and NH₃ (6 slm) were fed into the growth furnace to grow a GaN protective layer while the temperature in the growth furnace was being increased from 750° C. to 860° C. The GaN protective layer had a thickness of 2.5 nm. The average growth rate of the GaN protective layer was 0.8 nm/min.

After the growth of the GaN protective layer, TMG (24.4 µmol/min) and NH₃ (6 slm) were fed into the growth furnace to grow a GaN barrier layer while the temperature in the growth furnace was maintained at 860° C. The GaN barrier layer had a thickness of 12.5 nm. The average growth rate of the GaN barrier layer was 6.7 nm/min.

Figure 14:
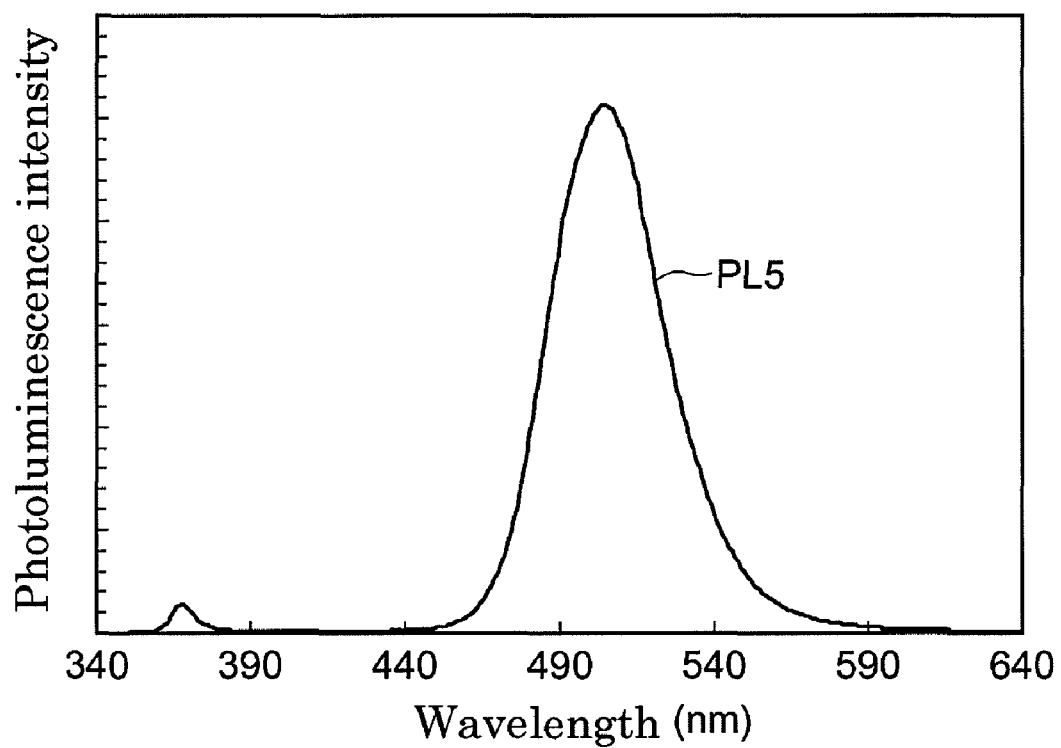
FIG. 14 is a graph showing a PL spectrum in Example 4.

The repetition of the growth of the InGaN well layer, the GaN protective layer, and the GaN barrier layer resulted in the active layer. Then a p-type gallium nitride-based semiconductor region was deposited as in Example 1. FIG. 14 shows a PL spectrum.

| PL | Growth temperature $T_W$ (° C.) | Growth temperature $T_P$ (° C.) | Full width at half maximum (nm) | Peak wavelength (nm) |
|---|---|---|---|---|
| PL5 (semipolar) | 770 | With temperature rising | 42 | 506 |
| PL4 (c-plane) | 760 | With temperature rising | 53 | 529 |

In the growth method according to this Example, the comparison between PL1 and PL5 showed that an increase in the thickness of the protective layers improved of a protective effect against the increase in temperature. The full width at half maximum of PL5 was smaller than that of PL4. The shape of the PL spectrum of PL5 was sharper than that of PL4. Furthermore, the PL intensity of PL5 was increased. The comparison between PL4 and PL5 showed that the semiconductor crystals constituting the well layers arranged on the c-plane were decomposed to increase the full width at half maximum of the PL spectrum. In contrast, the well layers arranged on the GaN wafer with an off-angle of 58° were not readily decomposed compared with the well layers arranged on the c-plane and exhibited satisfactory luminescence properties.

Third Embodiment

Figure 15:
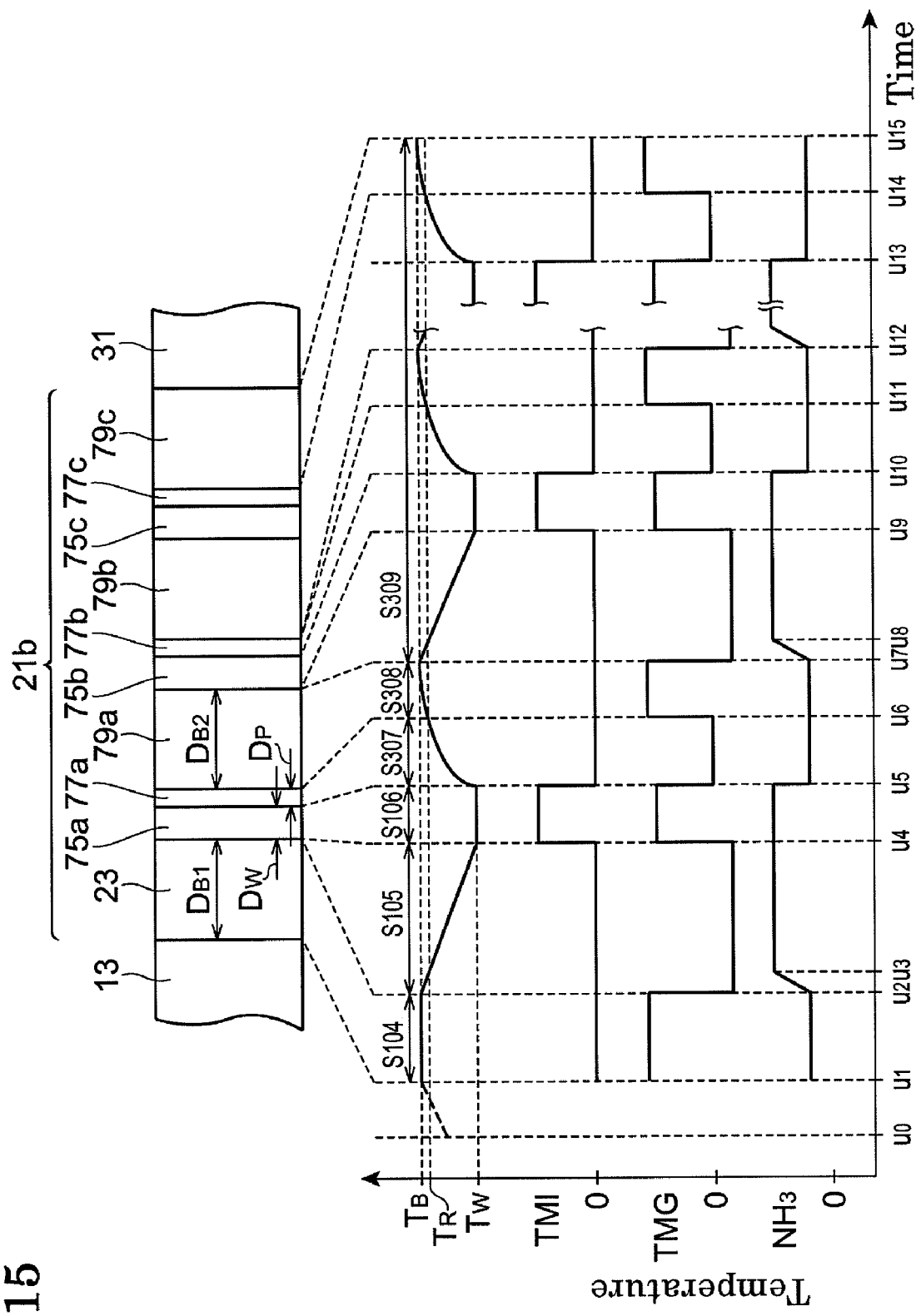
FIG. 15 is a time chart showing the flow of raw-material gases and a change in temperature in a growth furnace during the formation of an active layer according to a third embodiment.

In this embodiment, an active layer 21b of a nitride semiconductor light-emitting device is formed. A process of forming the quantum well structure of the active layer 21b will be described in detail below with reference to FIG. 15. FIG. 15 is a time chart showing the flow of raw-material gases and a change in temperature in the growth furnace during the formation of the active layer.

The temperature of the growth furnace means a temperature of a component, such as a susceptor, in the growth furnace. At time u0, the deposition of a gallium nitride-based semiconductor that will be overlaid with the active layer is completed. The temperature in the growth furnace 10 is changed to a temperature at which a semiconductor constituting the active layer is grown, between times u0 and u1. Like the first embodiment, in step S104, an epitaxial semiconductor region 23 composed of a gallium nitride-based semiconductor is formed at a growth temperature $T_B$ between times u1 and u2. The GaN barrier layer $D_{B1}$ has a thickness of, for example, 15 nm. The surface structure of the main surface 13a is taken over by the surface of the epitaxial semiconductor region 23. At time u2, the supply of the gallium source is stopped to terminate the deposition of the gallium nitride-based semiconductor. In step S105, the temperature in the growth furnace is changed from the growth temperature $T_B$ to a growth temperature $T_W$ before the growth of the well layer.

The temperature is changed between times u2 and u4. The amount of the nitrogen source supplied is changed to the amount of the nitrogen source supplied for the growth of the well layer between times u2 and u3. At time u4, the temperature in the growth furnace 10 reaches the growth temperature $T_W$ of the well layer. Like the first embodiment, in step S106, a well layer 75a for the quantum well structure is grown on the semipolar main surface 23a between times u4 and u5 while the temperature in the growth furnace 10 is maintained at the growth temperature $T_W$ of the well layer. The well layer 75a is epitaxially grown on the main surface of the epitaxial semiconductor region 23. Thus, the surface structure of the epitaxial semiconductor region 23 is taken over by the surface of the well layer 75a. The InGaN well layer has a thickness $D_W$ of, for example, 3 nm.

At time u5, the growth of the well layer 75a is completed. In step S307, the temperature is changed from the growth temperature $T_W$ to a growth temperature $T_B$ of a second barrier layer 79a. This temperature increase is performed between, for example, times u5 and u7. To prevent the deterioration of the well layer 75a during the temperature increase, a protective layer 77a is grown so as to cover the surface of the well layer 75a between times u5 and u6. Immediately after the completion of the growth of the well layer 75a, the growth of the protective layer 77a is initiated so as to cover the well layer 75a. The temperature change during the growth of the protective layer 77a is performed by reducing the rate of temperature increase with time, so that the temperature profile curve between times u5 and u6 is convex upward. According to this heating profile, a period of time required to increase the temperature required to reach growth temperature $T_B$ and then stabilize the temperature is reduced, thereby preventing the deterioration of the well layer. Like the protective layer 27a, the protective layer 77a is composed of a gallium nitride-based semiconductor having a higher band gap energy than the material constituting the well layer 75a. The protective layer 77a is epitaxially grown over a period between times u5 and u6. The protective layer 77a has a smaller thickness than the barrier layer 79a. Furthermore, the protective layer 77a has a smaller thickness than the well layer 75a. The protective layer 77a is grown at a growth rate lower than that of the barrier layer 79a. For example, the growth rate is adjusted by reducing the amount of the gallium source supplied and the amount of the nitrogen source supplied between times u5 and u7. In this embodiment, the protective layer 77a is composed of GaN, which is a material the same as that constituting the epitaxial semiconductor region 23. The protective layer 77a has a thickness $D_P$ of, for example, 1.1 nm. The protective layer 77a is epitaxially grown on the main surface of the well layer 75a. Thus, the surface structure of the well layer 75a is taken over by the surface of the protective layer 77a.

In step S308, the barrier layer 79a is grown subsequent to the growth of the protective layer 77a. Also at time u6, the increase in temperature in the growth furnace 10 is continued.

After the growth of the protective layer 77a, the barrier layer 79a composed of a gallium nitride-based semiconductor is grown between times u6 and u7 while the temperature in the growth furnace 10 is being increased to the growth temperature $T_B$. The growth temperature $T_B$ is equal to or higher than the first temperature $T_R$ that enables the barrier layer having satisfactory crystalline quality to grow. The growth temperature $T_P$ for the protective layers 77a, 77b, and 77c is in the range of the well-layer-growth temperature $T_W$ to the first temperature $T_R$. In this embodiment, the growth temperature $T_P$ of the protective layers 77a to 77c is higher than the growth temperature $T_W$. The barrier layer 79a has a larger thickness $D_{B2}$ than the thickness $D_P$ of the protective layer 77a. By reducing the thickness of the protective layer 77a, which does not serve as a well layer or barrier layer, the thickness of the barrier layer 79a may be increased. In this embodiment, the barrier layer 79a is composed of, for example, GaN. The barrier layer 79a has a thickness $D_{B2}$ of, for example, 13.9 nm. The barrier layer 79a is epitaxially grown on the main surface of the protective layer 77a. Thus, the surface structure of the well layer 75a is taken over by the surface of the barrier layer 79a.

As shown in FIG. 15, the formation of the active layer 21b is continued in the same way as above. In step S309, a reduction in temperature from the growth temperature $T_B$ to the growth temperature $T_W$ (between times u7 and u9), the growth of a well layer (between times u9 and u10), and an increase in temperature from the growth temperature $T_W$ to the growth temperature $T_B$, and the growth of a protective layer (between times u10 and u11 and between u13 and u14) and the growth of a barrier layer (between times u11 and u12 and between u14 and u15) are repeated to complete a quantum well structure. As shown in FIG. 15, the quantum well structure includes the barrier layers 23 and 79a and barrier layers 79b and 79c, the well layer 75a and well layers 75b and 75c, and the protective layer 77a and protective layers 77b and 77c. Each of the protective layers 77a to 77c may have a thickness $D_P$ of 0.5 nm to 5 nm.

Immediately after the completion of the growth of the well layers 75a to 75c, each of the protective layers 77a to 77c are grown while the temperature is being increased from the growth temperature $T_W$ to the growth temperature $T_B$. The temperature in the growth furnace 10 is increased while each of the protective layers 77a to 77c is being grown. Thus, the well layers 75a to 75c having semipolar main surfaces are not readily decomposed compared with a well layer grown on the c-plane main surface. Furthermore, the protective layers 77a to 77c and the barrier layers 79a to 79c are grown while the temperature is being increased, thus reducing the period for which the well layers 75a to 75c are exposed to a high temperature. In the temperature profile according to this embodiment, the average heating rate from the growth temperature $T_W$ to the temperature $T_R$ is higher than the average heating rate from the temperature $T_R$ to the growth temperature $T_B$. According to this method, the rate of temperature change is high during the period for which the protective layer is grown. Thus, the growth temperature of the protective layer increases with time, providing the protective layer with satisfactory crystalline quality.

Example 5

Off Angle: 75°

A GaN wafer was prepared. A main surface of the GaN wafer was tilted at an angle of 75° with respect to the c-plane of the GaN wafer. After the GaN wafer was placed in a growth furnace, heat treatment was performed in an atmosphere containing ammonia and hydrogen. The heat treatment temperature was 1,050° C. The heat treatment time was about 10 minutes. The same production conditions as those shown in FIG. 7 were used, except for growth conditions of the active layer.

The growth conditions of the active layer were described below. TMG (24.4 μmol/min) and NH$_3$ (6 slm) were fed into the growth furnace to grow an undoped GaN layer (barrier layer) on an n-type InGaN layer at 870° C. The GaN barrier layer had a thickness of 15 nm. The growth rate of the GaN layer was 6.7 nm/min.

Next, the temperature in the growth furnace was changed from 870° C. to 745° C. After the completion of the temperature change, TMG (15.6 μmol/min), TMI (58.0 μmol/min), and NH$_3$ (8 slm) were fed into the growth furnace to grow an undoped InGaN layer (well layer) on the GaN barrier layer at 745° C. The InGaN layer had a thickness of 4 nm. The growth rate of the InGaN well layer was 3.6 nm/min. The InGaN layer had an In composition of 0.20.

After the growth of the InGaN well layer, TMG (24.4 μmol/min) and NH$_3$ (6 slm) were fed into the growth furnace to grow a GaN protective layer while the temperature in the growth furnace was being increased from 745° C. to 850° C. The GaN protective layer had a thickness of 1.1 nm. The average growth rate of the GaN protective layer was 1.1 nm/min.

After the growth of the GaN protective layer, TMG (24.4 μmol/min) and NH$_3$ (6 slm) were fed into the growth furnace to grow a GaN barrier layer while the temperature in the growth furnace was being increased from 850° C. to 870° C. The GaN barrier layer had a thickness of 13.9 nm. The average growth rate of the GaN barrier layer was 6.7 nm/min.

Repetitions of an InGaN well layer, a GaN protective layer, and a GaN barrier layer resulted in an active layer. Then a p-type gallium nitride-based semiconductor region was deposited as in Example 1.

Like the Example 1, a sapphire (0001) substrate was prepared separately from the GaN wafer. The same stack semiconductor structure as the structure of the epitaxial wafer using the GaN wafer was formed on the sapphire substrate under proper production conditions. Main production conditions for an epitaxial wafer using the sapphire substrate will be described below. After the sapphire substrate was placed in the growth furnace, heat treatment was performed in a hydrogen atmosphere. The heat treatment temperature was 1,100° C. The heat treatment time was about 10 minutes. After the heat treatment, TMG (49 μmol/min) and NH$_3$ (5 slm) were fed into the growth furnace to grow an undoped GaN layer on the sapphire substrate at 500° C. Then TMG (243.8 μmol/min), NH$_3$ (5.0 slm), and SiH$_4$ were fed into the growth furnace to grow an n-type GaN layer on the undoped GaN layer at 950° C. The n-type GaN layer had a thickness of 5,000 nm. The growth rate of the n-type GaN layer was 129.6 nm/min. Well layers were grown at 760° C. Other production conditions were the same as the conditions for the GaN substrate.

Figure 16:
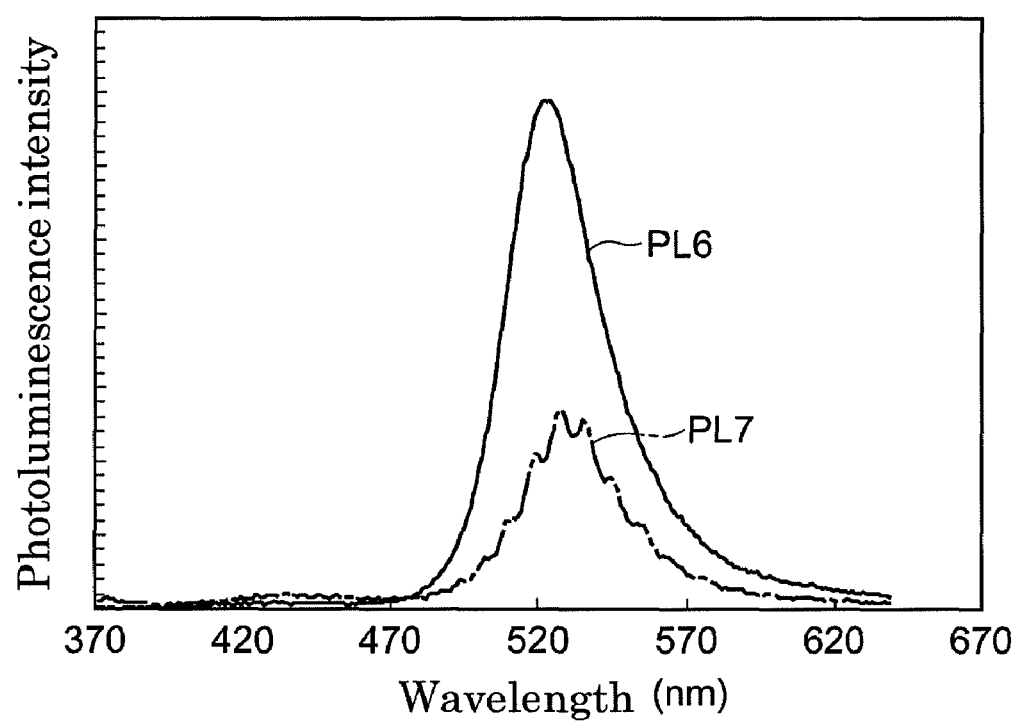
FIG. 16 is a graph showing PL spectra in Example 5.

The epitaxial wafer using the GaN wafer and the epitaxial wafer using the sapphire substrate have the same structure in that the protective layers were arranged on the respective well layers. The well layers of these epitaxial wafers, however, differ from each other in that each of the well layers of the epitaxial wafer using the GaN wafer has the semipolar surface (off-angle 75°), and each of the well layers of the epitaxial wafer using the sapphire substrate has the c-plane surface. Photoluminescence (PL) spectra of these epitaxial wafers were measured. FIG. 16 shows PL spectra PL6 and PL7 of light-emitting devices produced under representative conditions. These PL spectra and the formation conditions of the well layers are shown below.

| PL | Growth temperature $T_W$ (° C.) | Growth temperature $T_P$ (° C.) | Full width at half maximum (nm) | Peak wavelength (nm) |
|---|---|---|---|---|
| PL6 (semipolar) | 745 | With temperature rising | 35 | 526 |
| PL7 (c-plane) | 760 | With temperature rising | 45 | 531 |

In the growth method according to this Example, the comparison between PL1 and PL6 showed that an increase in the thickness of the protective layers improved a protective effect against the increase in temperature. Referring to FIG. 16, the full width at half maximum of PL6 was smaller than that of PL7. The shape of the PL spectrum of PL6 was sharper than that of PL7. Furthermore, the PL intensity of PL6 was increased. Referring to FIG. 16, the comparison between PL6 and PL7 showed that the semiconductor crystals constituting the well layers arranged on the c-plane were decomposed to increase the full width at half maximum of the PL spectrum. In contrast, the semiconductor crystals constituting the well layers arranged on the GaN wafer with an off-angle of 75° were not readily decomposed compared with the well layers arranged on the c-plane and exhibited satisfactory luminescence properties. The barrier layers were grown while the temperature was being increased, thereby reducing the time required for the epitaxial growth and inhibiting the decomposition of the semiconductor crystals constituting the well layers. Part of the barrier layer was grown at a temperature equal to or lower than the temperature $T_R$, resulting in unsatisfactory quality of the crystals constituting the quantum well structure arranged on the c-plane substrate and thus reducing luminescence properties. Furthermore, the use of the semipolar surface reduces the effect of a piezoelectric field.

Figure 17:
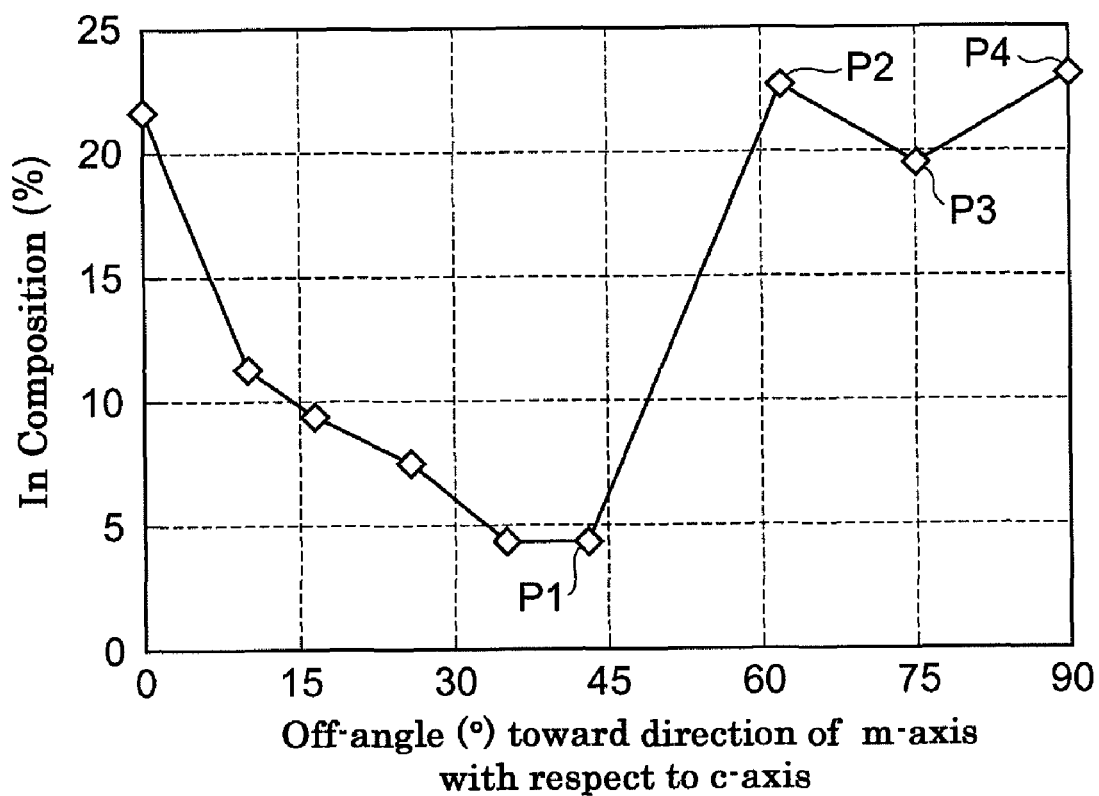
FIG. 17 is a graph showing the relationship between the In composition and the tilt angle (off-angle) of InGaN deposited on a GaN main surface tilted at a specified off-angle toward the direction of the m-axis with respect to the c-axis.

FIG. 17 shows the dependence of an indium composition on the off-angle.

| Specimen | Off angle (°) | Indium composition (%) |
|---|---|---|
| P1 | 43 | 4.3 |
| P2 | 62 | 22.7 |
| P3 | 75 | 19.6 |
| P4 | 90 | 23.1 |

In the GaN wafer having the main surface tilted with respect to the c-plane, the indium composition was changed in response to the off-angle. According to findings by the inventors, an off-angle of 50° or more and less than 80° resulted in a large indium composition. Thus, it is probable that the semiconductor crystals constituting the well layers were not readily decomposed even when the InGaN well layers were exposed at a high temperature.

On the uppermost surface during epitaxial growth in the NH$_3$ atmosphere, NH$_x$ seems to be bonded to a group III atom. On the c-plane, NH$_x$ is bonded to only a single group III atom; hence, the thermal decomposition of InGaN grown on the c-plane occurs readily. On the semipolar surface, in contrast, NH$_x$ can be bonded to two or more group III atoms. Furthermore, the proportion of NH$_x$ bonded to two or more group III atoms is remarkably higher than that on the c-plane. Thus, on the semipolar surface, the bond strength between constituent elements is high; hence, the thermal decomposition of InGaN grown on the semipolar surface does not readily occur compared with InGaN grown on the c-plane. Accordingly, the surfaces of the InGaN well layers grown on the semipolar surface differ from the surfaces of the InGaN well layers grown on the c-plane.

On a semiconductor surface, e.g., a (20-21) surface, corresponding to an off-angle of more than 50° and less than 80°, the width of each of the terraces is small. Thus, when In is incorporated on the terraces, indium is not significantly migrated. Hence, even while the growth is interrupted, In atoms tend to be maintained at positions where In atoms are adsorbed when deposited. Therefore, the decomposition of the well layers does not readily occur.

With respect to a material that can be used, examples of combinations of well layer/protective layer/barrier layer include InGaN/InGaN/GaN, InGaN/GaN/InGaN, and InGaN/InGaN/InGaN.

According to the preferred embodiments, the principle of the present invention has been illustrated and described. However, it should be understood by those skilled in the art that changes in arrangement and details can be made without departing from the principle of the invention. The present invention is not limited to specific configurations described in those embodiments. Thus, all modifications and changes within the claims and the spirit thereof are covered.

What is claimed is:

1. A method for producing a nitride semiconductor optical device, comprising the steps of:
   growing a well layer on a gallium nitride-based semiconductor region having a semipolar main surface while a temperature in a growth furnace is maintained at a well-layer-growth temperature, the well layer constituting a part of an active layer;
   growing a protective layer that covers the main surface of the well layer immediately after the completion of the growth of the well layer; and
   growing a barrier layer on the main surface of the protective layer at a barrier-layer-growth temperature after the growth of the protective layer, the barrier layer constituting a part of the active layer
   wherein the thickness of the protective layer is smaller than the thickness of the barrier layer,
   the barrier-layer-growth temperature is equal to or higher than a first temperature that is higher than the well-layer-growth temperature,
   the growth of the barrier layer is initiated when the temperature in the growth furnace reaches the first temperature,
   the growth temperature of the protective layer is a temperature equal to or more than the well-layer-growth temperature, and less than the first temperature,
   the well layer is composed of an indium-containing gallium nitride-based semiconductor,
   the barrier layer is composed of a nitride semiconductor having a band gap energy larger than the band gap energy of the well layer,
   the protective layer is composed of a gallium nitride-based semiconductor having a band gap energy higher than the band gap energy of the well layer,
   the main surface of the well layer has a semipolar surface,
   the main surface of the protective layer has a semipolar surface, and
   the main surface of the barrier layer has a semipolar surface.

2. The method according to claim 1, further comprising a step of:
   increasing the temperature in the growth furnace from the well-layer-growth temperature to the first temperature without performing a growth operation after the growth of the protective layer,
   wherein the protective layer is grown at the same temperature as the well-layer-growth temperature before the initiation of the temperature change in the growth furnace.

3. The method according to claim 1, wherein the protective layer is grown while the temperature in the growth furnace is being increased from the well-layer-growth temperature.

4. The method according to claim 3,
   wherein the protective layer is grown over a period for which the temperature in the growth furnace is changed from the well-layer-growth temperature to the first temperature, and
   the barrier layer is grown immediately after the growth of the protective layer.

5. The method according to claim 3, further comprising a step of:
   increasing the temperature in the growth furnace from a second temperature to the first temperature after the growth of the protective layer without growing a gallium nitride-based semiconductor, the second temperature being lower than the barrier-layer-growth temperature,
   wherein the protective layer is grown during at least part of a period for which the temperature in the growth furnace is increased from the well-layer-growth temperature to the second temperature, and
   the average heating rate from the well-layer-growth temperature to the second temperature is higher than the average heating rate from the second temperature to the first temperature.

6. The method according to claim 1, wherein the barrier-layer-growth temperature is maintained at constant.

7. The method according to claim 1, wherein at least part of the barrier layer is grown while the temperature is being changed from the first temperature to a third temperature that is higher than the first temperature.

8. The method according to claim 7, wherein the average heating rate from the well-layer-growth temperature to the first temperature is higher than the average heating rate from the first temperature to the third temperature.

9. The method according to claim 1, wherein the amount of a gallium source supplied for the growth of the protective layer is smaller than the amount of the gallium source supplied for the growth of the barrier layer.

10. The method according to claim 1, further comprising a step of:
    preparing a substrate composed of a hexagonal semiconductor $In_S Al_T Ga_{1-S-T} N$ ($0 \leq S1$, $0 \leq T \leq 1$, and $0 \leq S+T \leq 1$),
    wherein a main surface of the substrate is tilted at an angle of 10° to 85° with respect to the {0001} or {000-1} plane of the hexagonal semiconductor.

11. The method according to claim 10, further comprising a step of:
    subjecting the main surface of the substrate to heat treatment to form a modified main surface on the substrate before the formation of a semiconductor on the substrate,
    wherein the heat treatment is performed in a gas atmosphere containing ammonia and hydrogen, and
    the gallium nitride-based semiconductor region is provided on the modified main surface of the substrate.

12. The method according to claim 10, further comprising a step of:
- epitaxially growing a first-conductivity-type gallium nitride-based semiconductor region on the substrate,
- wherein the main surface of the first-conductivity-type gallium nitride-based semiconductor region is tilted at an angle of more than 50° and less than 80° with respect to the {0001} or {000-1} plane of the gallium nitride-based semiconductor region.

13. The method according to claim 10,
- wherein the substrate includes a plurality of first regions in which the density of threading dislocations extending to the direction of the c-axis is higher than a first threading dislocation density, and a plurality of second regions in which the density of threading dislocations extending to the direction of the c-axis is lower than the first threading dislocation density,
- the first and second regions are alternately arranged, and
- the first and second regions are exposed on the main surface of the substrate.

14. The method according to claim 10, wherein each of the second regions has a threading dislocation density of less than $1 \times 10^7$ cm$^{-2}$.

15. The method according to claim 10, wherein the substrate is composed of GaN.

16. The method according to claim 1, wherein the main surface of the gallium nitride-based semiconductor region is tilted toward the direction of the a-axis of the gallium nitride-based semiconductor region.

17. The method according to claim 1, wherein the main surface of the gallium nitride-based semiconductor region is tilted toward the direction of the m-axis of the gallium nitride-based semiconductor region.

18. The method according to claim 1, wherein the main surface of the gallium nitride-based semiconductor region is tilted toward the direction of the <12-30> axis of the gallium nitride-based semiconductor region.

19. A method for producing an epitaxial wafer used for a nitride semiconductor optical device, comprising the steps of:
- preparing a substrate composed of a hexagonal semiconductor $In_SAl_TGa_{1-S-T}N$ ($0 \leq S \leq 1$, $0 \leq T \leq 1$, and $0 \leq S+T \leq 1$) and having a semipolar main surface;
- forming a gallium nitride-based semiconductor region on the main surface of the substrate, the gallium nitride-based semiconductor region having a semipolar main surface;
- growing a well layer on the gallium nitride-based semiconductor region while a temperature in a growth furnace is maintained at a well-layer-growth temperature, the well layer constituting a part of an active layer;
- growing a protective layer that covers the main surface of the well layer; and
- growing a barrier layer on the main surface of the protective layer at a barrier-layer-growth temperature after the growth of the protective layer, the barrier layer constituting a part of the active layer,
- wherein the thickness of the protective layer is smaller than the thickness of the barrier layer,
- the barrier-layer-growth temperature is equal to or higher than a first temperature that is higher than the well-layer-growth temperature,
- the growth of the barrier layer is initiated when the temperature in the growth furnace reaches the first temperature,
- the growth temperature of the protective layer is a temperature equal to or more than the well-layer-growth temperature, and less than the first temperature,
- the well layer is composed of an indium-containing gallium nitride-based semiconductor,
- the barrier layer is composed of a nitride semiconductor having a band gap energy larger than the band gap energy of the well layer,
- the protective layer is composed of a gallium nitride-based semiconductor having a band gap energy higher than the band gap energy of the well layer,
- the main surface of the well layer has a semipolar surface,
- the main surface of the protective layer has a semipolar surface, and
- the main surface of the barrier layer has a semipolar surface.

20. The method according to claim 19, further comprising a step of:
- subjecting the main surface of the substrate to heat treatment to form a modified main surface on the substrate before the formation of a semiconductor on the substrate,
- wherein the heat treatment is performed in a gas atmosphere containing ammonia and hydrogen, and
- the main surface of the substrate is tilted at an angle of more than 50° and less than 80° with respect to the {0001} or {000-1} plane of the hexagonal semiconductor.

* * * * *

UNITED STATES PATENT AND TRADEMARK OFFICE
CERTIFICATE OF CORRECTION

PATENT NO. : 8,183,071 B2  Page 1 of 1
APPLICATION NO. : 12/539887
DATED : May 22, 2012
INVENTOR(S) : Akita et al.

It is certified that error appears in the above-identified patent and that said Letters Patent is hereby corrected as shown below:

In the Claims:

At column 30, claim 10, line 53, replace "$0 \leq S1$" with --$0 \leq S1 \leq 1$--.

Signed and Sealed this
Eleventh Day of September, 2012

David J. Kappos
*Director of the United States Patent and Trademark Office*